United States Patent
Staszewski et al.

(10) Patent No.: US 7,483,508 B2
(45) Date of Patent: Jan. 27, 2009

(54) ALL-DIGITAL FREQUENCY SYNTHESIS WITH NON-LINEAR DIFFERENTIAL TERM FOR HANDLING FREQUENCY PERTURBATIONS

(75) Inventors: Robert B. Staszewski, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 795 days.

(21) Appl. No.: 10/306,655

(22) Filed: Nov. 27, 2002

(65) Prior Publication Data

US 2003/0141936 A1 Jul. 31, 2003

Related U.S. Application Data

(60) Provisional application No. 60/386,290, filed on Jun. 5, 2002, provisional application No. 60/344,305, filed on Dec. 28, 2001, provisional application No. 60/343,846, filed on Dec. 28, 2001, provisional application No. 60/343,837, filed on Dec. 28, 2001, provisional application No. 60/333,169, filed on Nov. 27, 2001, provisional application No. 60/333,144, filed on Nov. 27, 2001, provisional application No. 60/333,115, filed on Nov. 27, 2001.

(51) Int. Cl.
 *H03D 3/24* (2006.01)
(52) U.S. Cl. .................. 375/376; 375/375; 375/374; 375/373; 375/327; 327/147; 327/156
(58) Field of Classification Search .......... 375/327, 375/306, 307, 344, 345, 373–376; 331/34, 331/41, 48, 55, 88, 90; 327/147, 156
See application file for complete search history.

(56) References Cited

U.S. PATENT DOCUMENTS

| | | | | |
|---|---|---|---|---|
| 4,213,129 A | * | 7/1980 | Kennedy et al. | 342/51 |
| 4,471,299 A | * | 9/1984 | Elmis | 324/76.82 |
| 4,568,888 A | * | 2/1986 | Kimura et al. | 331/10 |
| 4,851,848 A | * | 7/1989 | Wehner | 342/25 D |
| 5,181,115 A | * | 1/1993 | Flamm et al. | 348/537 |
| 5,339,050 A | * | 8/1994 | Llewellyn | 331/16 |
| 5,381,116 A | * | 1/1995 | Nuckolls et al. | 331/1 A |
| 5,859,816 A | * | 1/1999 | Yamamoto | 369/44.25 |
| 6,366,622 B1 | * | 4/2002 | Brown et al. | 375/322 |
| 6,549,765 B2 | * | 4/2003 | Welland et al. | 455/260 |
| 6,680,653 B2 | * | 1/2004 | Griffith et al. | 331/17 |
| 6,993,314 B2 | * | 1/2006 | Lim et al. | 455/333 |
| 2002/0034932 A1 | * | 3/2002 | Welland | 455/260 |

OTHER PUBLICATIONS

"Digital Phase-Domain PLL Frequency Synthesizer", U.S. Appl. No. 09/603,023, filed Jul. 26, 2000.

(Continued)

*Primary Examiner*—Phuong Phu
(74) *Attorney, Agent, or Firm*—Ronald O. Neerings; Wade James Brady, III; Frederick J. Telecky, Jr.

(57) ABSTRACT

An all-digital frequency synthesizer architecture is built around a digitally controlled oscillator (DCO) that is tuned in response to a digital tuning word (OTW). In exemplary embodiments: (1) a gain characteristic ($K_{DCO}$) of the digitally controlled oscillator can be determined by observing a digital control word before and after a known change ($\Delta f_{max}$) in the oscillating frequency; (2) a portion (TUNE_TF) of the tuning word can be dithered (1202), and the resultant dithered portion ($d_k^{TF}$) can then be applied to a control input of switchable devices within the digitally controlled oscillator; and (3) a non-linear differential term (187, 331) can be used to expedite correction of the digitally controlled oscillator when large phase error changes (335) occur.

39 Claims, 24 Drawing Sheets

OTHER PUBLICATIONS

"Digital Fractional Phase Detector", U.S. Appl. No. 09/608,317, filed Jun. 30, 2000.

"Digitally-Controlled L-C Oscillator", U.S. Appl. No. 09/679,793, filed Oct. 5, 2000.

"All-Digital Frequency Synthesis with DCO Gain Calculation", U.S. Appl. No. 10/302,029, filed Nov. 22, 2002.

"All-Digital Frequency Synthesis with Capacitive Re-introduction of Dithered Tuning Information", U.S. Appl. No. 10/301,895, filed Nov. 22, 2002.

* cited by examiner

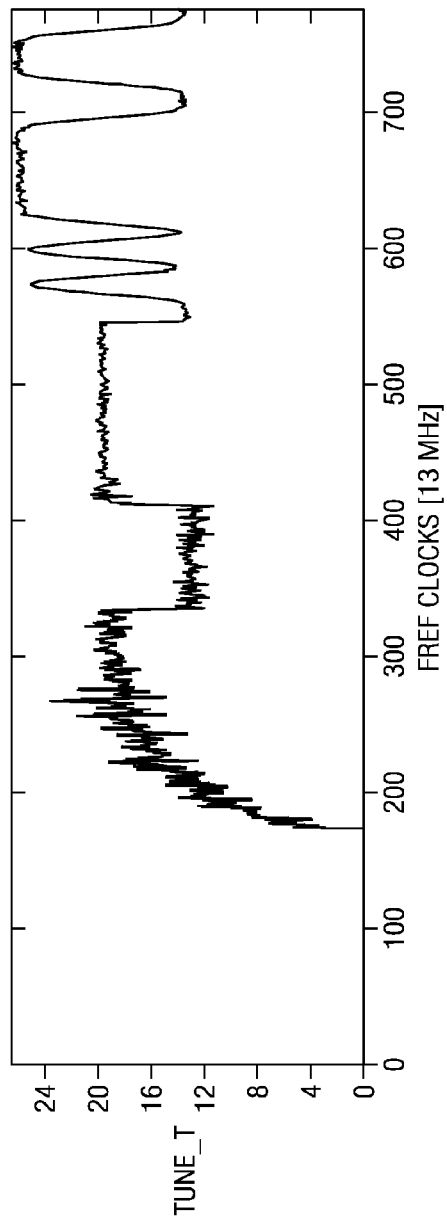
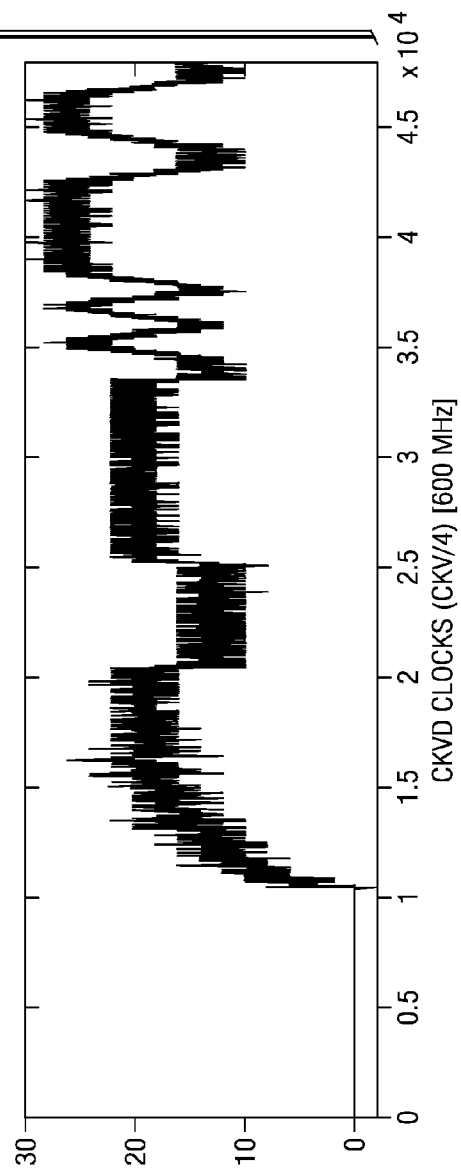
FIG. 19
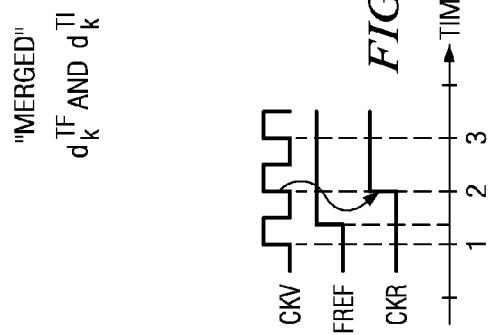
FIG. 20

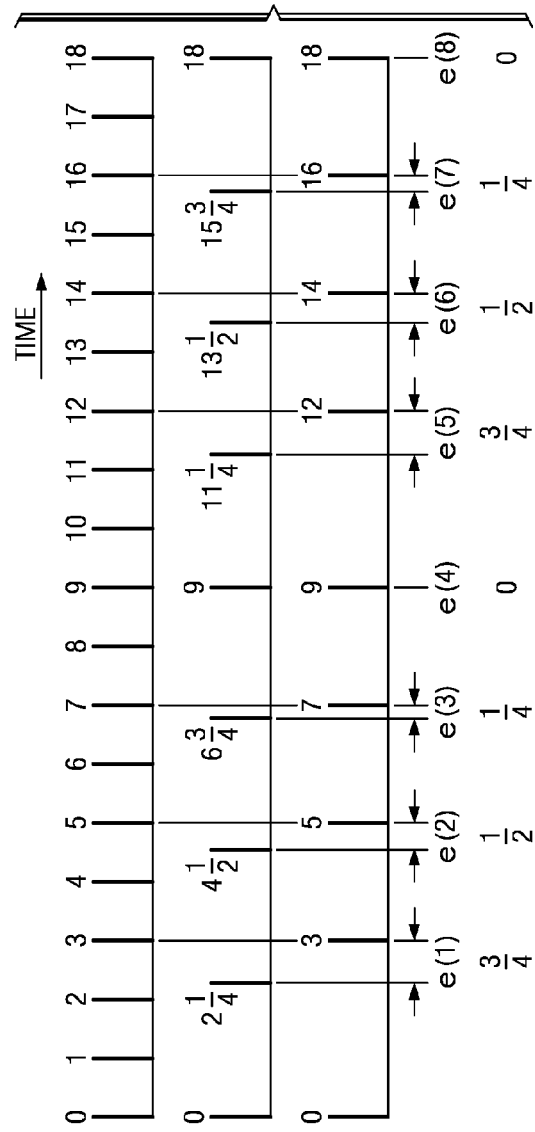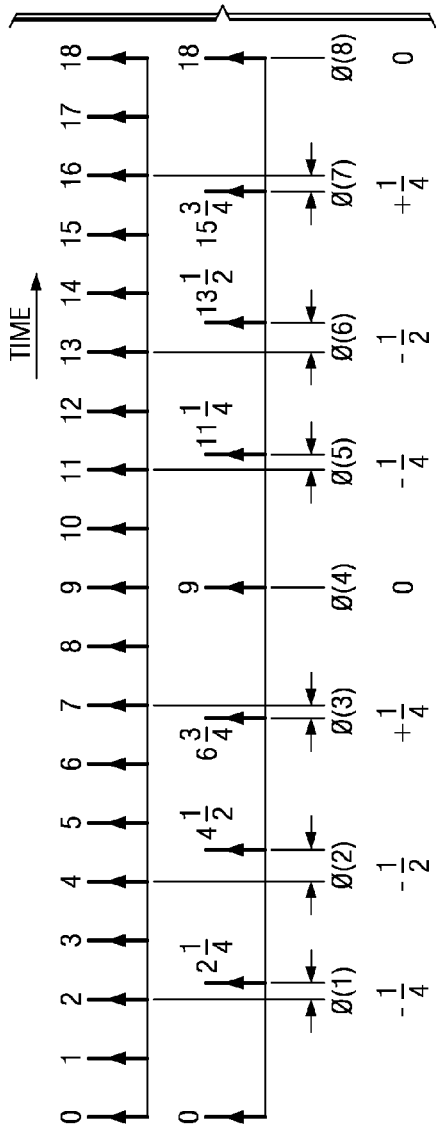

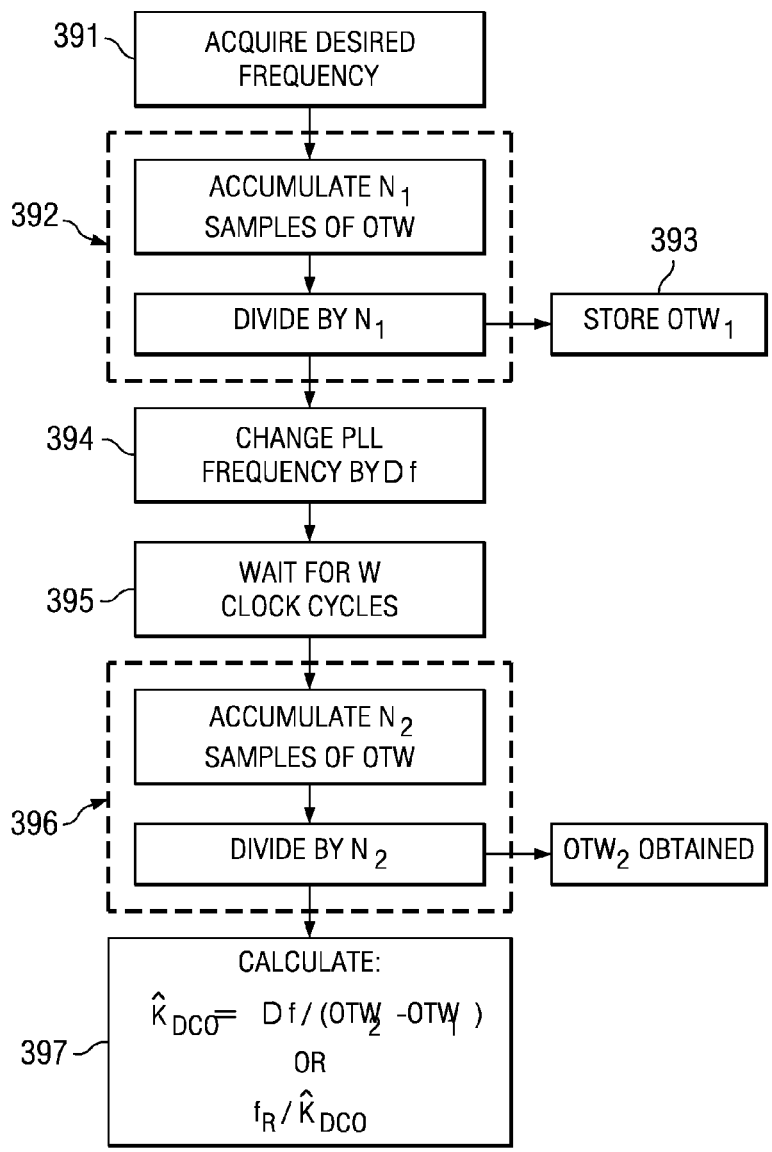
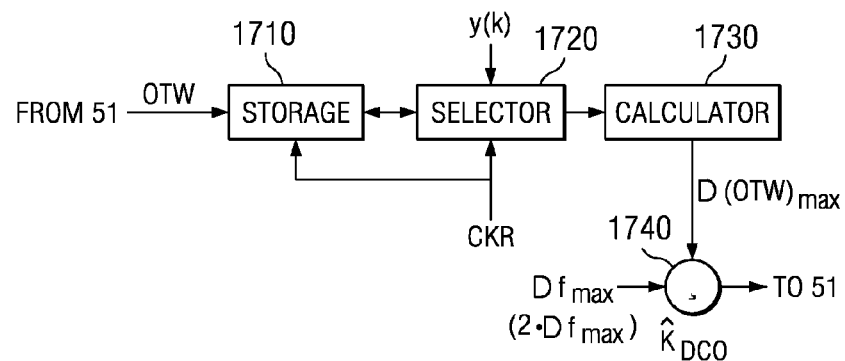

ALL-DIGITAL FREQUENCY SYNTHESIS WITH NON-LINEAR DIFFERENTIAL TERM FOR HANDLING FREQUENCY PERTURBATIONS

This application claims the priority under 35 U.S.C. 119 (e)(1) of the following U.S. provisional patent applications, all of which are incorporated herein by reference: 60/333,144 filed on Nov. 27, 2001; 60/333,115 filed on Nov. 27, 2001; 60/333,169 filed on Nov. 27, 2001; 60/343,846 filed on Dec. 28, 2001; 60/344,305 filed on Dec. 28, 2001; 60/343,837 filed on Dec. 28, 2001; and 60/386,290 filed on Jun. 5, 2002.

FIELD OF THE INVENTION

The invention relates generally to communications and, more particularly, to all-digital frequency synthesis for communications applications.

BACKGROUND OF THE INVENTION

A great reduction of the transistor feature size in recently developed deep-submicron CMOS processes shifts the design paradigm towards more digitally-intensive techniques. In a monolithic implementation, the manufacturing cost of a design is measured not in terms of a number of devices used but rather in terms of the occupied silicon area, and is little dependent on the actual circuit complexity. The testing part of the overall cost does indeed depend on the circuit complexity, but a large number of digital gates typically have a higher test coverage and lower testing cost than even a small analog circuit.

Each new digital CMOS process advance occurs roughly 18 months while increasing the digital gate density by a factor of two (known as the Moore's Law). A typical digital cellular phone on the market today contains over a million transistors. Analog and RF circuits, on the other hand, do not scale down very well. For example, a known CMOS process with 0.08 µm L-effective feature size achieves digital gate density of 150K equivalent (2-input NAND) gates per $mm^2$, which is an order of magnitude greater than with more traditional RF BiCMOS process technologies. An average-size inductor for an integrated LC oscillator occupies about 0.5 $mm^2$ of silicon area. A low-noise charge pump, or a low-distortion image-reject mixer, both good examples of classical RF transceiver components, occupy roughly about the same area, which could be traded for tens of thousands of digital gates, which is a lot of DSP power. Consequently, there are numerous incentives to look for digital solutions.

Migrating to the digitally-intensive RF front-end architecture could bring forth the following well-known advantages of a conventional digital design flow:

Fast design turn-around cycle using automated CAD tools (VHDL or Verilog hardware-level description language, synthesis, auto-place and auto-route with timing-driven algorithms, parasitic backannotation and postlayout optimization).

Much lower parameter variability than with analog circuits.

Ease of testability.

Lower silicon area and dissipated power that gets better with each CMOS technology advancement (also called a "process node").

Excellent chances of first-time silicon success. Commercial analog circuits usually require several design, layout and fabrication iterations to meet marketing requirements.

There is a wide array of opportunities that integration presents. The most straightforward way would be to merge various digital sections into a single silicon die, such as DRAM or flash memory embedded into DSP or controller. More difficult would be integrating the analog baseband with the digital baseband. Care must be taken here to avoid coupling of digital noise into the high-precision analog section, usually through substrate or power/ground supply lines. In addition, the low amount of voltage headroom challenges one to find new circuit and architecture solutions. Integrating the analog baseband into the RF transceiver section presents a different set of challenges: The conventional Bi-CMOS RF process is tuned for high-speed operation with a number of available passive components and does not fundamentally stress high precision.

Sensible integration of diverse sections results in a number of advantages:

Lower total silicon area. In a deep-submicron CMOS design, the silicon area is often bond-pad limited. Consequently, it is beneficial to merge various functions onto a single silicon die to maximize the core to bond-pad ratio.

Lower component count and thus lower packaging cost.

Power reduction. There is no need to drive large external inter-chip connections.

Lower printed-circuit board (PCB) area, thus saving the precious "real estate."

Deep-submicron CMOS processes present new integration opportunities on one hand, but make it extremely difficult to implement traditional analog circuits, on the other. For example, frequency tuning of a low-voltage deep-submicron CMOS oscillator is an extremely challenging task due to its highly nonlinear frequency vs. voltage characteristics and low voltage headroom making it susceptible to the power/ground supply and substrate noise. In such low supply voltage case, not only the dynamic range of the signal suffers but also the noise floor rises, thus causing even more severe degradation of the signal-to-noise ratio. At times, it is possible to find a specific solution, such as utilizing a voltage doubler. Unfortunately, with each CMOS feature size reduction, the supply voltage needs also to be scaled down, which is inevitable in order to avoid breakdown and reliability issues.

Moreover, the high degree of integration leads to generation of substantial digital switching noise that is coupled through power supply network and substrate into noise sensitive analog circuits. Furthermore, the advanced CMOS processes typically use low resistance P-substrate which is an effective means in combating latchup problems, but exacerbates substrate noise coupling into the analog circuits. This problem only gets worse with scaling down of the supply voltage. Fortunately, there is a serious effort today among major IC fabrication houses to develop CMOS processes with higher resistivity silicon substrates.

Circuits designed to ensure the proper operation of RF amplifiers, filters, mixers, and oscillators depend on circuit techniques that operate best with long-channel, thick-oxide devices with supply voltage of 2.5 V or higher. The process assumed herein for exemplary and explanatory purposes is optimized for short-channel, thin-oxide devices operating as digital switches at only 1.5 V.

In order to address the various deep-submicron RF integration issues, some new and radical system and architectural changes have to be discovered. Alternative approaches and architectures for RF front-end are herein explored. This will allow easy integration of RF section into digital baseband.

RF synthesizers, specifically, remain one of the most challenging tasks in mobile RF systems because they must meet very stringent requirements of a low-cost, low-power and low-voltage monolithic implementation while meeting the phase noise and switching transient specifications. They are being selected and ranked according to the following set of criteria:

Phase noise performance—as any analog circuits, oscillators are susceptible to noise, which causes adverse affects in the system performance during receive and transmit.

Discrete spurious noise performance—unwanted frequency components to appear in the oscillator output spectrum.

Switching speed—very important in modem communications systems which utilize channel and frequency hopping in order to combat various wireless channel impairments (fading, interference, etc.). Since the system switches carrier frequency often (as fast as once every 1.6 ms in BLUETOOTH), a fast switching and stable frequency synthesizer is essential for proper operation. Switching speed is also important in a fixed-channel time-division multiple access (TDMA) systems for quick handoff.

Frequency and tuning bandwidth—the frequency range has to cover the operational band and have enough margin for process-voltage-temperature variations.

Power consumption—important for battery operated mobile communication units.

Size—important for mass production deployment.

Integrateability—utilizing the deep-submicron CMOS process technology in order to integrate with digital baseband.

Cost—no extra cost added to the process. Requires minimal amount of external components (so called "bill of materials").

Portability—ability to transfer the design from one application to another and from one process technology node to the next. An important issue in digital VLSI and for intellectual property (IP)-based applications. Designs described in a hardware description language (HDL) are very portable.

The present invention provides an all-digital frequency synthesizer architecture built around a digitally controlled oscillator that is tuned in response to a digital tuning word. In exemplary embodiments: (1) a gain characteristic of the digitally controlled oscillator can be determined by observing a digital control word before and after a known change in the oscillating frequency; (2) a portion of the tuning word can be dithered, and the resultant dithered portion can then be applied to a control input of switchable devices within the digitally controlled oscillator; and (3) a non-linear differential term can be used to expedite correction of the digitally controlled oscillator when large phase error changes occur.

BRIEF DESCRIPTION OF THE DRAWINGS

FIG. 19 graphically illustrates exemplary operations of the oscillator tracking portions illustrated in FIG. 17.

FIG. 20 is a timing diagram which illustrates the retiming of a frequency reference to achieve clock domain synchronization.

FIG. 21 is a timing diagram which illustrates fractional error correction associated with clock domain synchronization according to the invention.

FIG. 22 is a timing diagram which illustrates a prior art approach to phase error correction.

FIG. 39 illustrates exemplary operations for estimating the gain of a digitally controlled oscillator according to the invention.

FIG. 40 diagrammatically illustrates exemplary embodiments of a gain estimator for a digitally controlled oscillator according to the invention.

DETAILED DESCRIPTION

Figure 1:
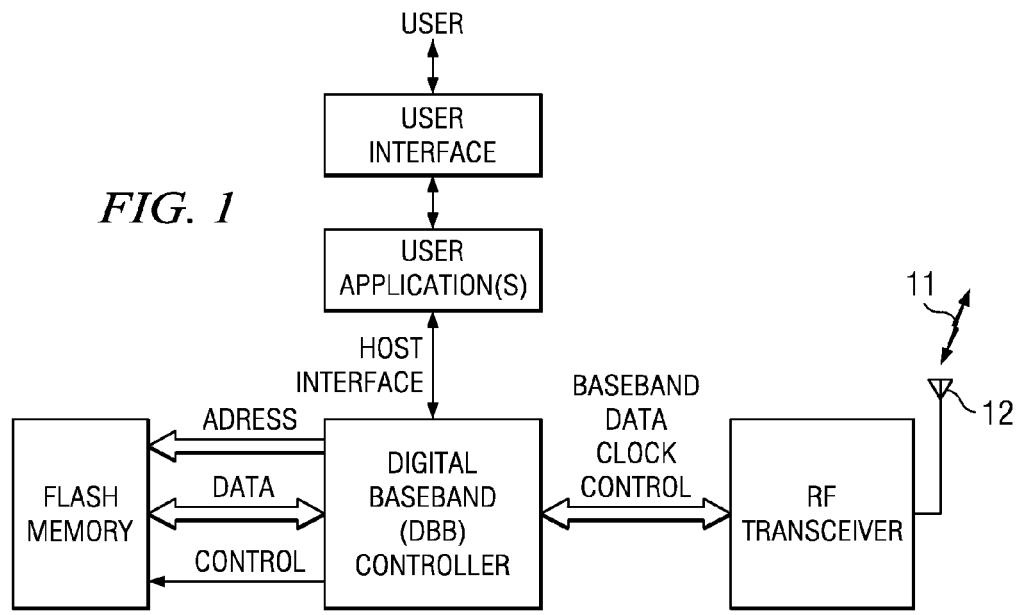
FIG. 1 diagrammatically illustrates exemplary embodiments of a communication apparatus according to the invention.

The ultimate goal in mobile wireless integration is a single-chip digital radio as shown in FIG. 1, although the present invention is not limited to use in a single chip digital radio design. In some examples, the digital baseband controller (DBB) can be based on a digital signal processor (DSP) or the ARM7 microprocessor and is responsible for taking the digital data stream from the RF transceiver and performing any necessary digital signal processing on it to convert the digital data stream into a stream of user data. Examples of the processing performed by the DBB controller may include digital filtering, data encoding and decoding, error detection and correction. It can also implement, for example, the GSM cellular or BLUETOOTH protocol layer stack which is controlled by a software program stored in a non-volatile flash memory. User applications running on, for example, a microprocessor or DSP, can communicate with the DBB controller and a user interface (e.g., a keypad, visual display, speaker, microphone, etc.). The host interface can utilize, for example, UART, USB or RS-232. The RF transceiver module implements the physical layer by converting the information bits to/from the RF waveform. An antenna structure 12 interfaces the digital radio to a wireless RF communication link 11. The advanced deep-submicron CMOS process total integration leads to an extremely compact and economic implementation of this sophisticated and highly functional communication system.

Figure 2:
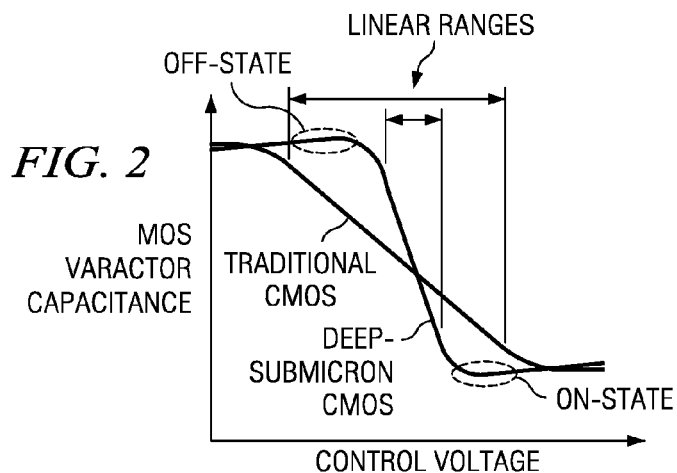
FIG. 2 graphically illustrates the control/voltage curves for two different types of MOS varactors.

Frequency tuning of a low-voltage deep-submicron CMOS oscillator is quite a challenging task due to its highly nonlinear frequency-vs.-voltage characteristics and low voltage headroom. FIG. 2 shows normalized representative curves of a MOS varactor capacitance vs. control voltage (C-V curve) for both a traditional CMOS process and a deep-submicron process. Previously, a large linear range of the C-V curve could be exploited for a precise and wide operational control of frequency. With a deep-submicron process, the linear range now is very compressed and has undesirable high gain ($K_{VCO}=\Delta f/\Delta V$) which makes the oscillator extremely susceptible to noise and operating point shifts.

Figure 4:
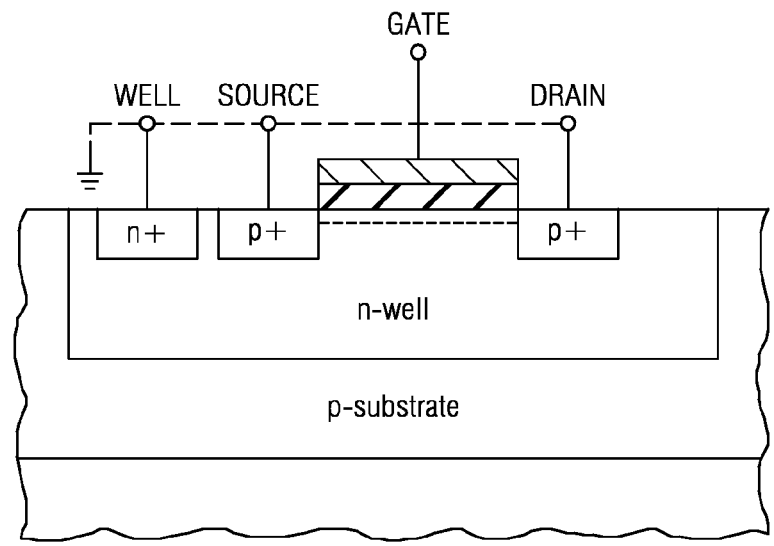
FIG. 4 diagrammatically illustrates a PMOS transistor configured for use as a varactor.

FIG. 4 illustrates physical structure of a PMOS transistor used as a varactor when the source, drain and well tie-offs are tied to ground.

Figure 3:
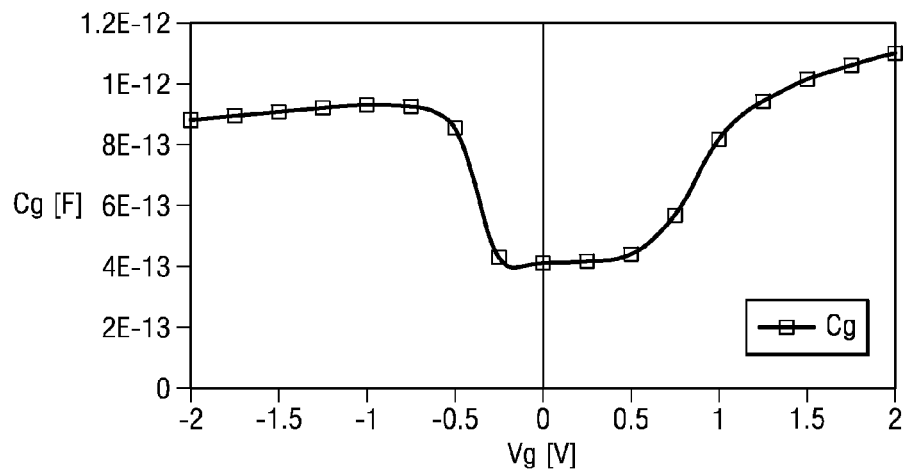
FIG. 3 graphically illustrates the control/voltage curve for a PMOS varactor.

An example C-V curve of an actual PMOS varactor is shown in FIG. 3. Because of the well isolation properties in this N-well process, the PMOS device (FIG. 4) is a better candidate for a varactor. It was experimentally found that in this process the NPOLY/NWELL inversion-type varactor features more distinctly defined operational regions than does the accumulation-type varactor. The device has the following channel length and width dimensions and finger multiplicity: L=0.5 µm, W=0.6 µm, N=8 fingers×12×2. The measurements were performed at the intended frequency of operation of 2.4 GHz. In this configuration, the source, the drain and the well are all tied to ground.

Still referring to FIG. 3 and FIG. 4, let the gate potential $V_g$ start at +2 V, at the right end of the C-V x-axis. The positively charged gate attracts a large number of electrons, which are the majority carriers of the N-type well. The varactor capacitance is relatively high because this structure behaves like a parallel-plate capacitor with only the silicon oxide in between. The gate conductor forms one plate of the capacitor and the high concentration of electrons in the N-well forms the second plate. This region of operations is termed the accumulation mode. As $V_g$ is lowered, less and less electrons are attracted to the region below the gate and its concentration drops. This causes the effective "bottom" plate to be further separated, thus lowering the gate-to-well capacitance. As soon as the gate potential is close to zero and enters negative values, the electrons start being repelled causing a depletion region under the gate. Now the structure is in the depletion mode. The capacitance gets lower and lower while the depletion region increases. Lowering $V_g$ further below the (negative) threshold level $V_t$ results in holes being attracted to the region under the gate. This gives rise to a conductive layer of holes and this region of operation is called the inversion mode. Because the "bottom" plate of the capacitor is just below the gate oxide, the gate capacitance is high again. A strong inversion layer exists at $V_G$=−2 V.

The slight drop of capacitance in the "flat" strong inversion region in FIG. 3 had not been of any practical significance until the advent of deep-submicron CMOS processes. It is due to the depletion layer being created in the gate polysilicon which is less doped and much thinner than in the past.

In this varactor structure, the source, drain and backgate are tied to the same zero potential. This is very similar to the classical MOS capacitor structure, except that the latter does not have the source and drain. The inversion region in the MOS capacitor relies on a process of thermal regeneration of electron and hole pairs, which takes an extremely long amount of time (on the order of µs) to create a channel. Consequently, the channel never manages to get created and destroyed for the RF range of frequencies. In the MOS varactor, on the other hand, the source and drain regions serve as vast and ready reservoirs of electrons, so this problem does not exist.

Weighted binary switchable capacitance devices, such as varactors, can be used to control the oscillating frequency according to the invention. An array of varactors can be switched into a high-capacitance mode or a low-capacitance mode individually by a two-level digital control voltage bus, thus giving a very coarse step control for the more-significant bits, and less coarse step control for the less-significant bits. In order to achieve a very fine frequency resolution, the LSB bit can be operated in an analog fashion. (A similar idea could be used which employs a hybrid of digital oscillator control for PVT and analog control for acquisition and tracking.) However, this requires a digital-to-analog converter and does not fundamentally solve the problem of the nonlinear gain ($K_{VCO}$) characteristics of a voltage-controlled oscillator (VCO). A better solution is to dither the LSB digital control bit (or multiple bits), thus controlling its time-averaged value with a finer resolution. Consequently, each varactor could be allowed to stay in only one of the two regions where the capacitance sensitivity is the lowest and the capacitance difference between them is the highest. These two operating regions are shown by the ovals in FIG. 2. The resonant frequency of an LC tank oscillator can also be set by controlling the inductance. The operating frequency of a ring oscillator can be set by controlling the transconductance or resistance or capacitance of its elements.

There have not been any reports in the literature of a fully digitally controlled oscillator (DCO) for RF applications. Lack of the fully digital control is a severe impediment for the total integration in a deep-submicron CMOS process for the reasons mentioned above. Due to the fact that there are several known ring-oscillator-based DCO's for clock recovery and clock generation applications, where the frequency resolution and spurious tone level are quite relaxed, it seems that the latter two concerns have been an effective deterrent against digital RF synthesizers for wireless communications. The inventive combination of various circuit and architectural techniques has brought to fruition a fully digital solution that has an extremely fine frequency resolution with low spurious content and low phase noise.

Figure 5:
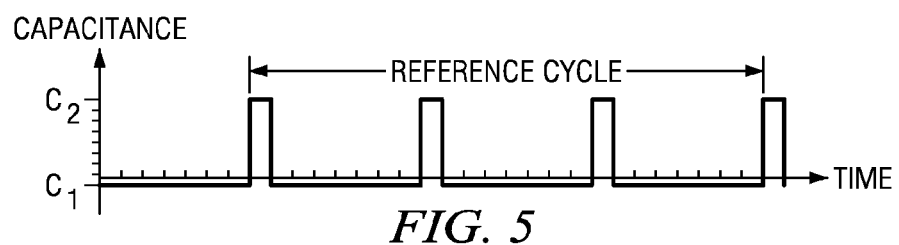
FIG. 5 is a timing diagram which illustrates an example of how the capacitances of two different varactors can be controlled.

The idea of high-rate dithering of LSB capacitors is illustrated in FIG. 5. Instead of applying a constant input that would select capacitance $C_1$ or $C_2$ (where $C_2=C_1+\Delta C$ with $\Delta C$ being an LSB capacitor), during the entire reference cycle, the selection alternates between $C_1$ and $C_2$ several times during the cycle. In the example of FIG. 5, $C_2$ is chosen one-eighth of the time and $C_1$ is chosen the remaining seven-eighths. The average capacitance value, therefore, will be one-eighth of the $C_2-C_1$ distance over $C_1$, i.e., $C_1+\Delta C/8$. If the dithering speed is performed at a fast enough rate, the resulting spurious tone at the oscillator output could be made vanishingly small. It should also be noted that the resolution of the time-averaged value relies on the dithering speed. Without any feedback that would result in a supercycle, the dithering rate has to be higher than the reference cycle rate times the integer value of the resolution inverse (eight in this case). Therefore, there is a proportional relationship between the frequency resolution improvement and the dithering rate.

The dithering pattern shown in FIG. 5 is not random at all and is likely to create spurious tones. It is equivalent to first order $\Sigma\Delta$ modulation.

Figure 6:
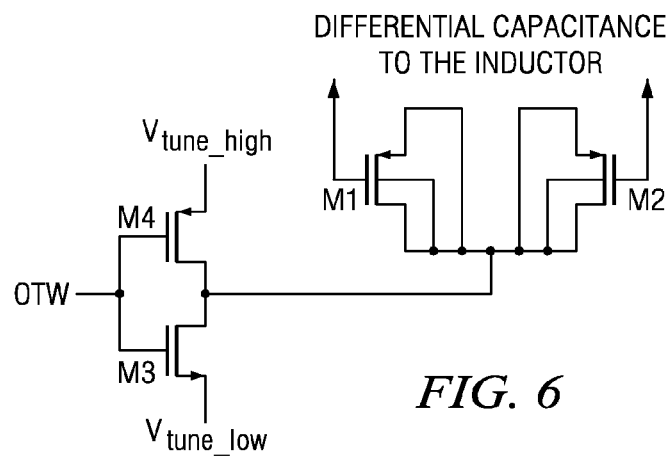
FIG. 6 diagrammatically illustrates a differential varactor and predriver stage according to the invention.

FIG. 6 shows an exemplary implementation of a differential varactor and the preceding driver stage according to the invention. The $V_{tune\_high}$ and $V_{tune\_low}$ rail supply levels of the inverter are set to correspond with the two stable operating points, off-state and on-state, as shown by the ovals in FIG. 2. The varactor of FIG. 6 has a differential configuration built upon the basic structure described in conjunction with FIG. 3 and FIG. 4. The balanced capacitance is between the gates of both PMOS transistors M1 and M2, whose source, drain and backgate connections are shorted together and tied to the M3/M4 inverter output. Since the voltage control is now applied to the backgate and source/drain, the negative and decreasing values of $V_g$ in FIG. 3 covering the inversion mode are of interest. Because of the differential configuration, only one-half of the single PMOS capacitance is achieved.

The circuit of FIG. 6 also reveals a phase noise contribution mechanism from the static tuning input OTW. When either of the driving transistors (M3 or M4) is turned on, its channel resistance generates a thermal noise $$\overline{e_n^2} = 4kTR\Delta f \quad (1)$$

where $\overline{e_n^2}$ is the rms square open-circuit noise voltage generated by the driving resistance R over the bandwidth $\Delta f$ at a given temperature T; k is a Boltzmann's constant. As an example, a 50Ω resistance generates about 0.9 nV of rms noise over a bandwidth of 1 Hz. This noise is added to the stable control voltage which then perturbs the varactor capacitance. This, in turn, perturbs the oscillating frequency and gives rise to the phase noise. These observations favor selection of large W/L ratios of the driver stage transistors in order to reduce the driving resistance and hence thermal voltage noise, and a careful selection of the operational states on the C-V curve (FIG. 3) that would result in the smallest possible capacitance sensitivity to the voltage noise.

Figure 7:
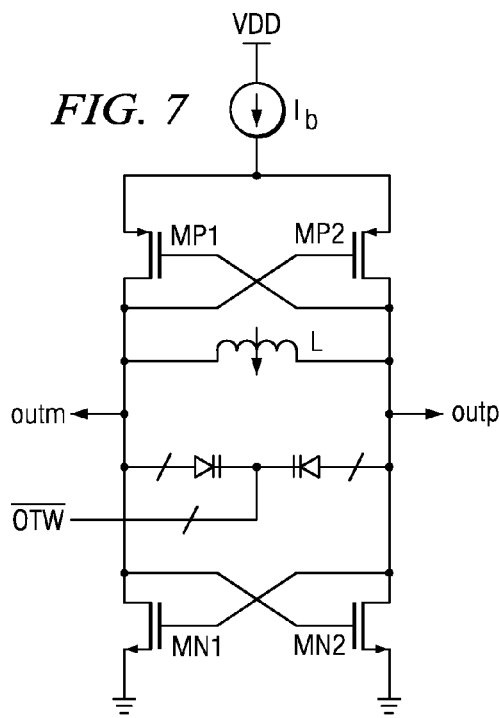
FIG. 7 diagrammatically illustrates a digitally controlled oscillator according to the invention.

FIG. 7 shows a schematic of an exemplary DCO according to the invention. The inductor is connected in parallel with an array of the differential varactors. NMOS transistors MN1 and MN2 comprise the first cross-coupled pair that provide a negative resistance to the LC tank. PMOS transistors MP1 and MP2 provide a second such pair. The current source $I_b$ limits the amount of current the oscillator is allowed to draw. The differential oscillator output ("outp" and "outm") can be fed to a differential-to-complementary circuit whose purpose is to square the near-sinusoidal outputs and make them insensitive to common mode level. This structure of forming the negative resistance by double cross-connection of transistor pairs is known in the art. It has inherent low power since the current used for amplification is utilized twice. This invention replaces "analog" varactors with a digitally-controlled varactor array.

Figure 8:
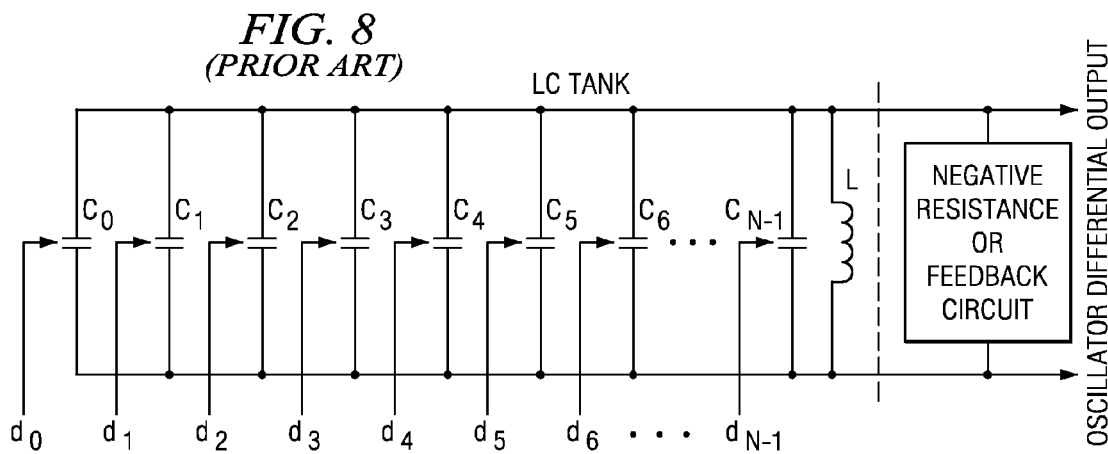
FIG. 8 diagrammatically illustrates a fully digitally controlled LC tank oscillator.

The idea of the digitally-controlled LC tank oscillator is shown from a higher system level in FIG. 8. The resonating frequency of the parallel LC tank is established by the following formula:

$$f = \frac{1}{2\pi\sqrt{L \cdot C}} \quad (2)$$

The oscillation is perpetuated by a negative resistance device, which is normally built as a positive feedback active amplifier network.

The frequency f could be controlled by either changing the inductance L or the total effective capacitance C. However, in a monolithic implementation it is more practical to keep the inductor fixed while changing capacitance of a voltage-controlled device, such as a varactor array.

Since digital control of the capacitance C is used, the total available capacitance is quantized into N smaller digitally-controlled varactors, which do not necessarily follow the binary-weighted pattern of their capacitance values. Equation 2 now becomes $$f = \frac{1}{2\pi\sqrt{L \cdot \sum_{k=0}^{N-1} C_k}} \quad (3)$$

The digital control $(d_0, d_1, \ldots d_{N-1})$ signifies that each of the individual capacitors (of index k) could be placed in either a high capacitative state $C_{1,k}$, or a low capacitative state $C_{0,k}$ (see also FIG. 2). The capacitance difference between the high and low capacitative states of a single bit k is $\Delta C_k = C_{1,k} - C_{0,k}$ and is considered the effective switchable capacitance. Since the frequency of oscillation varies inversely with the capacitance, increasing the digital control value must result in the increased frequency of oscillation. Therefore, the digital control state is opposite to the capacitative state, so the digital bits need to be inverted such that the kth capacitor could be expressed as $$C_k = C_{0,k} + \overline{d}_k \cdot \Delta C_k.$$

The bit inversion turns out to be quite convenient from the implementational point of view. FIG. 6 reveals that it is necessary to provide a buffering scheme that would (1) isolate the "raw" varactor input from the noisy digital circuits, (2) have sufficiently low driving resistance to minimize the thermal and flicker noise, and (3) establish two stable low and high voltage levels for the best varactor operation.

Equation 3 could be re-written to include the digital control details.

$$f = \frac{1}{2\pi\sqrt{L \cdot \sum_{k=0}^{N-1} (C_{0,k} + \overline{d}_k \cdot \Delta C_k)}} \quad (4)$$

Figure 9:
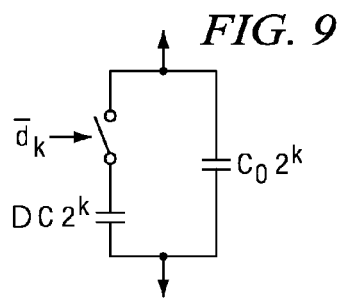
FIG. 9 diagrammatically illustrates a switchable capacitance according to the invention.

FIG. 9 shows a model of a single-cell binary-weighted switchable capacitor of index k, that is equivalent to the weight of $2^k$. The basic unit cell is created for the weight of $2^0$. The next varactor of weight $2^1$ is created not as a single device of double the unit area but it is built of two unit cells. This is done for matching purposes. It mainly ensures that the parasitic capacitance due to fringing electric fields, which is quite significant for a deep-submicron CMOS process and is extremely difficult to control and model, is well ratioed and matched. Each next cell consists of double the number of the unit cells. Even though the total occupied silicon area of the device multiplicity method is somewhat larger than the straightforward method of progressively larger uniform devices, it easily achieves the economical component matching resolution of eight bits.

When the $d_k$ digital control bit is 1, the only capacitance seen by the oscillating circuit is $C_0$ times the weight. This capacitance is always present signifying that the varactor could never be truly turned off. For this reason it could be considered a "parasitic" shunt capacitance. The total sum of these contributions $C_0$ sets the upper limit of the oscillating frequency for a given inductance L. When the digital control bit is 0, the $\Delta C$ capacitance times the weight is added. The index k of the binary-weighted capacitance can thus be described as $$C_k = C_{0,k} \cdot 2^k + \overline{d}_k \cdot \Delta C_k \cdot 2^k \quad (5)$$

making the total binary-weighted capacitance of size N:

$$C = \sum_{k=0}^{N-1} C_k = \sum_{k=0}^{N-1} (C_{0,k} \cdot 2^k + \overline{d}_k \cdot \Delta C_k \cdot 2^k) \quad (6)$$

$$= \sum_{k=0}^{N-1} C_{0,k} \cdot 2^k + \sum_{k=0}^{N-1} \overline{d}_k \cdot \Delta C_k \cdot 2^k \quad (7)$$

$$= C_0 + \sum_{k=0}^{N-1} \overline{d}_k \cdot \Delta C_k \cdot 2^k \quad (8)$$

Contributions from all the static shunt capacitances are lumped into $C_0$ in Equation 8, so the only adjustable components are the effective capacitances in the second term of Equation 8.

From the functional perspective, the above operation can be thought of as a digital-to-frequency conversion (DFC) with a digital control word comprising N bits designated as $d_k$, where $k=0,1,\ldots,N-1$, and wherein the digital control word directly controls the output frequency f. In order to illustrate that a straightforward DFC conversion to the RF range is not likely to work, consider the following example. For the BLUETOOTH application with the oscillating frequency in the RF band of 2.4 GHz and a frequency resolution of 1 kHz, at least 22 bits of DFC resolution is required. It is clearly difficult to achieve this kind of precision even with the most advanced component matching techniques. The best one could hope to economically achieve is 8 to 9 bits of capacitor matching precision, without resorting to elaborate matching schemes that often require numerous and time consuming design, layout and fabrication cycles. In fact, better than 10-bit resolution would normally require some digital error correction techniques.

One aspect of digital-to-frequency conversion for wireless communications differs significantly from the general digital-to-analog conversion, namely, the narrow-band nature of the wireless communication transmission. Consequently, even though the frequency command steps must be very fine, the overall dynamic range at a given time instant is quite small. For example, the nominal frequency deviation of the BLUETOOTH GFSK data modulation scheme is 320 kHz. For a 1 kHz frequency resolution, 9 bits can suffice (320 kHz/1 kHz=320<$2^9$). If not handled carefully, a much higher dynamic range is usually necessary to cover frequency channels of the RF band. For the BLUETOOTH band of 80 MHz, 17 bits of full 1 kHz resolution are thus required. Many more extra bits would be necessary to account for process and environmental (voltage and temperature) changes which could reach over +/−20% of the operational RF frequency.

Figure 10:
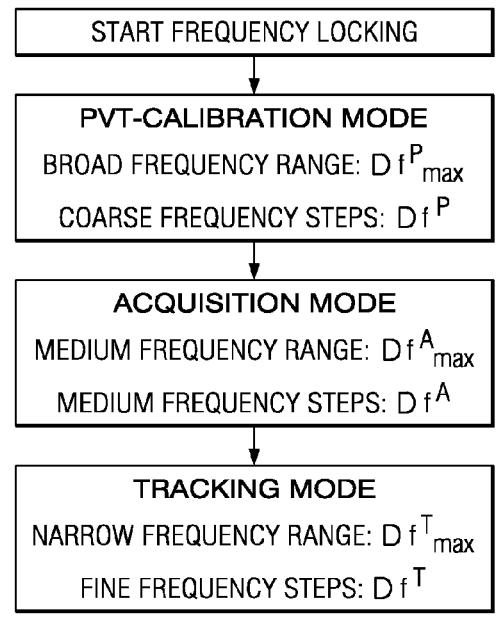
FIG. 10 illustrates exemplary frequency locking operations according to the invention.

One solution to the above dynamic range problem is to proportionately lower the frequency resolution whenever a higher dynamic range is expected. This is accomplished by traversing through the three major operational modes with progressively lower frequency range and higher resolution such that the intrinsically economical component matching precision of 8 bits is maintained (FIG. 10). In the first step, the large oscillating frequency uncertainty due to the process-voltage-temperature (PVT) variations is calibrated. After the PVT calibration, the nominal center frequency of the oscillator will be close to the center of the BLUETOOTH band. Since this uncertainty could easily be in the hundreds of megahertz range, a one or two MHz increments are satisfactory. In this case, an 8-bit resolution is sufficient. The second step is to acquire the requested operational channel within the available band. For an 8-bit resolution, half-MHz steps would span over 100 MHz which is enough for the 80 MHz BLUETOOTH band.

The third step, referred to generally as the tracking step, is the finest, but with the most narrow-band range. This step serves to track the frequency reference (referred to as "fast tracking" in FIG. 37) and perform data modulation (referred to as "regular tracking" in FIG. 37) within the channel. The 1 MHz channel spacing resolution of the BLUETOOTH band already starts at the first step (PVT) but because of the very coarse frequency selection grid possibly covering multiple channels, the best that could be achieved is to get near the neighborhood of the desired channel. It is in the second step (the acquisition mode) that the channel is approximately acquired. However, the fine selection of the requested channel could only be accomplished in the third step (the tracking mode), which is most refined of them all. Therefore, the tracking mode dynamic range has to additionally cover the resolution grid of the preceding acquisition mode. For the BLUETOOTH example, if frequency in the acquisition mode cannot be resolved to better than 500 kHz and the frequency modulation range is 320 kHz, then the dynamic range of the tracking mode should be better than 10 bits [(500 kHz+160 kHz)/1 kHz=660<$2^{10}$].

From the operational perspective, the varactor array is divided into three major groups (varactor banks) that reflect three general operational modes: process-voltage-temperature (PVT), acquisition and tracking. The first and second groups approximately set the desired center frequency of oscillation initially, while the third group precisely controls the oscillating frequency during the actual operation. During PVT and acquisition, the frequency range is quite high but the required precision is relatively low, therefore the best capacitor array arrangement here is the binary-weighted structure with a total capacitance (based on Equation 8) of $$C^P = C_0^P + \sum_{k=0}^{N^P-1} \overline{d}_k^P \cdot (\Delta C^P \cdot 2^k) \tag{9}$$

$$C^A = C_0^A + \sum_{k=0}^{N^A-1} \overline{d}_k^A \cdot (\Delta C^A \cdot 2^k) \tag{10}$$

where the superscripts P and A respectively designate PVT calibration mode and acquisition mode $N^P$ is the number of PVT-mode varactors, $N^A$ is the number of acquisition-mode varactors, $\Delta C^P$ and $\Delta C^A$ are the unit capacitance of LSB varactors, $\overline{d}_k^P$ and $\overline{d}_k^A$ are the inverted PVT and acquisition bits, respectively, of the DCO tuning word that controls capacitance of the varactor devices.

It is important to note that, at any given time, only varactors that belong to the same bank (i.e., bank P, A or T) are allowed to switch. Consequently, only the varactors in each bank need to be matched. This helps achieve a fine digital frequency resolution with only 8-bit basic resolution of component matching.

Figure 11:
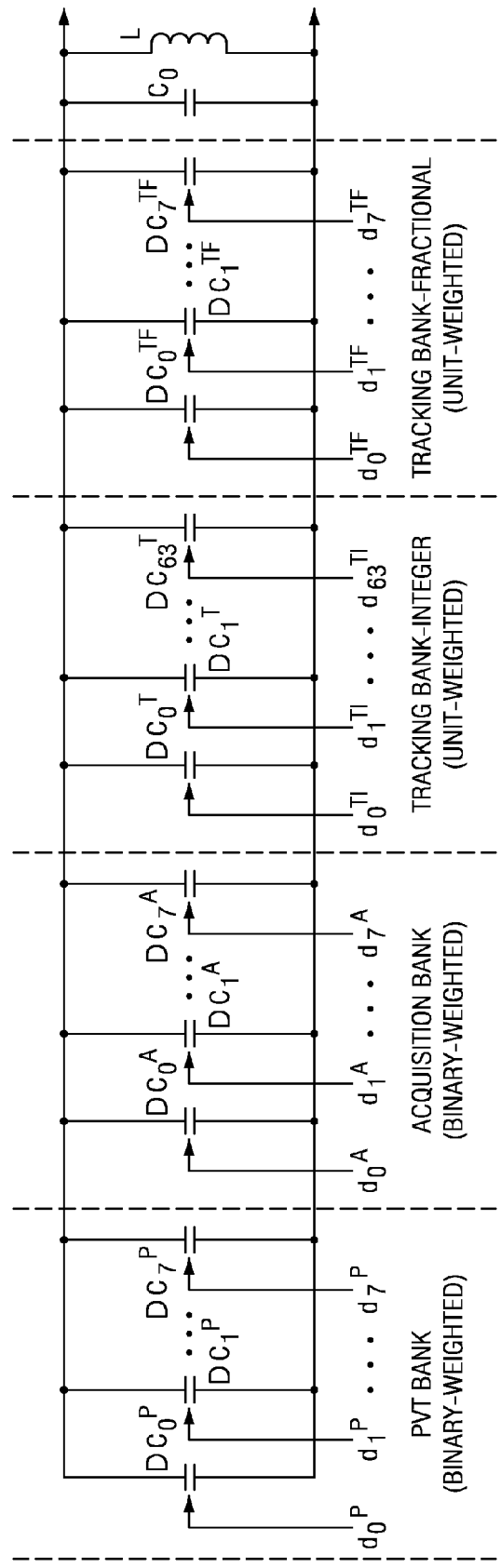
FIG. 11 diagrammatically illustrates a digitally controlled LC tank oscillator according to the invention for supporting operations such as illustrated in FIG. 10.

The P subgroup corrects the center oscillating frequency of the operational band due to process-voltage-temperature variations and could be performed at manufacturing, on power-up or on "as needed" basis. The A varactor group controls the frequency acquisition process for the desired transmission channel. Both the P and A groups are best implemented using individual binary-weighted capacitance structures, but their ranges could be overlapping. There is no need to preserve the binary-weight continuity between the P and A structures due to the different origin of their respective control inputs. The PVT correction is infrequent and could be usually done through register interface (e.g., lookup table created during factory calibration), whereas the acquisition DCO tuning is performed dynamically and is an integral part of the synthesizer PLL loop. FIG. 11 shows the dedicated capacitor banks, which are connected in parallel to create a larger quantized capacitance. Only the effective switchable capacitors are shown forming the banks. The individual shunt capacitances are indistinguishable from each other, therefore, they are lumped together as $C_0$. Also shown is a fractional-resolution tracking varactor bank for high-speed dithering, which will be discussed later.

The tracking-mode (T) operation presents, on the other hand, a different set of requirements. The frequency range is relatively low but the required resolution is quite high. The binary-weighted capacitance arrangement of the acquisition mode (A) is a poor choice here due to the following reasons: binary switching noise (changing a value by 1 LSB might require many bits to toggle; for example, incrementing decimal 31 causes six bits to flip), poor device matching of different size devices (2× precision matched capacitor is rarely implemented as twice the area—usually two identical devices are in parallel next to each other), etc. A better structure would be an array of unit devices of fine but identical dimensions. The total capacitance is $$C^T = C_0^T + \sum_{k=0}^{N^T-1} \overline{d}_k^T \cdot \Delta C^T \tag{11}$$

where $N^T$ is the number of tracking-mode varactors, $\Delta C^T$ is the unit switchable capacitance of each varactor and $\overline{d}_k^T$ are the inverted tracking bits of the DCO tuning word.

Since the relative capacitance contribution of the tracking bank is quite small as compared to the acquisition bank, the frequency deviation due to the tracking capacitors could be linearized by the df/dC derivative of Equation 3. Consequently, the frequency resolution or granularity of the LC tank oscillator is a function of the operating frequency f:

$$\Delta f^T(f) = f \cdot \frac{\Delta C^T}{2C} \tag{12}$$

where $\Delta C^T$ is the tracking-bank unit switchable capacitance and C is the total effective capacitance. The total tracking-bank frequency deviation is:

$$f^T(f) = \Delta f^T \cdot \sum_{k=0}^{N^T-1} d_k^T = f \frac{\Delta C^T}{2C} \cdot \sum_{k=0}^{N^T-1} d_k^T \qquad (13)$$

The tracking-bank encoding is classified as a redundant arithmetic system since there are many ways to represent a number. The simplest encoding would be a thermometer scheme with a predetermined bit order. A less restrictive numbering scheme can be chosen in order to facilitate a dynamic element matching—a technique to linearize the frequency-vs.-code transfer function.

Further refinement of the frequency resolution is obtained by performing a high-speed dither of one or a few of the tracking bits, as described hereinbelow.

The DCO operational mode progression could be mathematically described in the following way. Upon power-up or reset, the DCO is set at a center or "natural" resonant frequency $f_c$ by appropriately presetting the $d_k$ inputs. This corresponds to a state in which half or approximately half of the varactors are turned on, in order to maximally extend the operational range in both directions. The total effective capacitance value of the LC-tank is $C_c$ and the "natural" frequency is $$f_c = \frac{1}{2\pi\sqrt{L \cdot C_c}} \qquad (14)$$

During PVT mode, the DCO will approach the desired frequency by appropriately setting the $d^P$ control bits so that the new total effective capacitance is $C_{tot_P} = C_c + \Delta_{tot} C^P$, where $\Delta_{tot} C^P$ is the total capacitance attributable to the P bank. The resulting final frequency of the PVT mode is $$f_c^P = \frac{1}{2\pi\sqrt{L \cdot C_{tot,P}}} \qquad (15)$$

The acquisition mode will start from a new center frequency of $f_c^P$. It will approach the desired frequency by appropriately setting the $d^A$ control bits so that the new total capacitance is $C_{tot_A} = C_c + \Delta_{tot} C^P + \Delta_{tot} C^A$, where $\Delta_{tot} C^A$ is the total capacitance attributable to the A bank. The resulting final frequency of the acquisition mode is $$f_c^A = \frac{1}{2\pi\sqrt{L \cdot C_{tot,A}}} \qquad (16)$$

The following tracking mode will commence from a new center frequency of $f_c^A$. It will reach and maintain the desired frequency f by appropriately setting the $d^T$ control bits so that the new total capacitance is $C_{tot_T} = C_0 + \Delta_{tot} C^P + \Delta_{tot} C^A + \Delta_{tot} C^T$, where $\Delta_{tot} C^T$ is the total capacitance attributable to the T bank. The resulting frequency of the tracking mode is set by Equation 2.

The above-described mode progression process of FIG. 10 contains two successive mode switching events during which the center frequency is "instantaneously" shifted closer and then still closer towards the desired frequency. At the end of the PVT and acquisition modes, the terminating-mode capacitor state is frozen and it now constitutes a new center frequency ($f_c^P$ or $f_c^A$) from which the frequency offsets, during the following mode, are calculated.

At the heart of the frequency synthesizer lies the digitally-controlled oscillator DCO. It generates an output with a frequency of oscillation $f_V$ that is a physically-inherent function of the digital oscillator tuning word (OTW) input, $f_V$=f (OTW).

In general, f(OTW) is a nonlinear function. However, within a limited range of operation it could be approximated by a linear transfer function such that f(OTW) is a simple gain $K_{DCO}$, so $$f_V = f_0 + \Delta f_V = f_0 + K_{DCO} \cdot OTW \qquad (17)$$

where $\Delta f_V$ is a deviation from a certain center frequency $f_0$. For example, $f_0$ could be one of the mode-adjusted center frequencies ($f_c^P$ or $f_c^A$). $\Delta f_V$ must be sufficiently small such that the linear approximation is satisfied.

$K_{DCO}$ can be defined as a frequency deviation $\Delta f_V$ (in Hz) from a certain oscillating frequency $f_V$ in response to 1 LSB change in the input, OTW. Within a linear range of operation, $K_{DCO}$ can also be expressed as $$K_{DCO}(f_v) = \frac{\Delta f_v}{\Delta(OTW)} \qquad (18)$$

where $\Delta(OTW)$ designates a change in the OTW value. Within a limited range, $K_{DCO}$ should be fairly linear with respect to the input OTW, otherwise the DCO gain could be generalized as being also a function of OTW.

$$K_{DCO}(f_v, OTW) = \frac{\Delta f_v}{\Delta(OTW)} \qquad (19)$$

Due to its analog nature, the $K_{DCO}$ gain is subject to process and environmental factors which cannot be known precisely, so an estimate thereof, $\hat{K}_{DCO}$, must be determined. As described later, the estimate $\hat{K}_{DCO}$ can be calculated entirely in the digital domain by observing phase error responses to the past DCO phase error corrections. The actual DCO gain estimation involves arithmetic operations, such as multiplication or division, and averaging, and can be performed, for example, by dedicated hardware or a digital signal processor (DSP).

The frequency deviation $\Delta f_V$ of Equation 18 cannot be directly measured, except perhaps in a lab or a factory setting. Due to the digital nature of the synthesizer, $\Delta f_V$ can be, however, indirectly measured on-the-fly by harnessing the power of the existing phase detection circuitry, as described hereinbelow.

Figure 12:
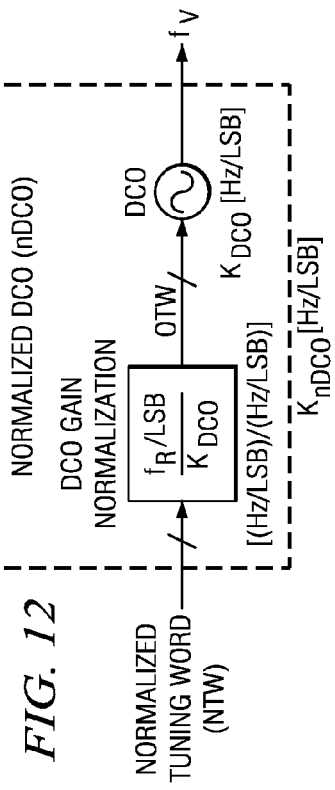
FIG. 12 diagrammatically illustrates a normalized digitally controlled oscillator according to the invention.

At a higher level of abstraction, the DCO oscillator, together with the DCO gain normalization multiplier $f_{R/}\hat{K}_{DCO}$, logically comprise the normalized DCO (nDCO), as illustrated in FIG. 12. The DCO gain normalization decouples the phase and frequency information throughout the system from the process, voltage and temperature variations that normally affect the $K_{DCO}$. The phase information is normalized to the clock period $T_V$ of the oscillator, whereas the frequency information is normalized to the value of an external reference frequency $f_R$. (Hereinafter, FREF designates a reference signal at reference frequency $f_R$). The digital input to the DCO gain normalizer of FIG. 12 is a fixed-point normalized tuning word NTW), whose integer part LSB corresponds to $f_R$. The reference frequency is chosen as the normalization factor because it is the master basis for the frequency synthesis. Another reason is that the clock rate and update operation of this discrete-time system is established by the frequency reference.

The gain $K_{DCO}$ should be contrasted with the process-temperature-voltage-independent oscillator gain $K_{nDCO}$ which is defined as the frequency deviation (in Hz units) of the DCO in response to a 1 LSB change of the integer part of the NTW input. If the DCO gain estimate is exact, then $K_{nDCO} = f_R/LSB$, otherwise $$K_{nDCO} = f_R / LSB \cdot \frac{K_{DCO}}{\hat{K}_{DCO}} \tag{20}$$

Figure 13:
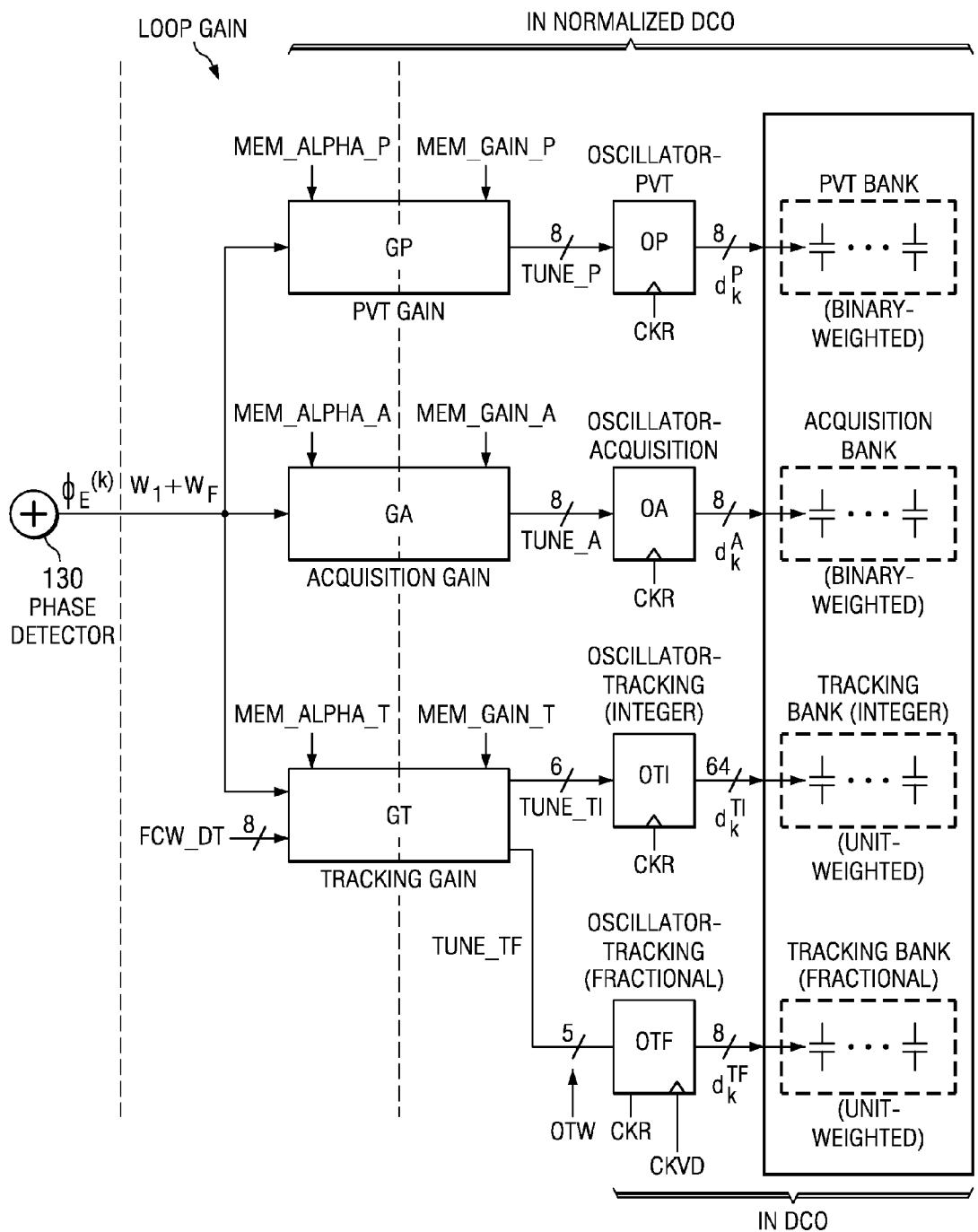
FIG. 13 diagrammatically illustrates pertinent portions of exemplary embodiments of an all digital frequency synthesizer according to the invention, including loop filter gain paths which correspond to the operations of FIG. 10.

FIG. 13 shows an exemplary implementation of three separate DCO loop filter gain paths for the three modes of operation: PVT, acquisition and tracking, as originally defined in FIG. 10. The tracking path additionally splits into integer (TUNE_TI) and fractional (TUNE_TF) parts, mainly due to their significantly different clock rates. Each of the switched capacitor array banks (first introduced in FIG. 11) is individually controlled by a respective oscillator interface circuit.

FIG. 13 shows that a phase detector output signal $\phi_E(k)$ is fed into three gain circuits (GP, GA and GT for the PVT, acquisition and tracking modes, respectively). Due to their vastly different gain ranges, each gain circuit could use a different subset of the full range of the phase error. The gain circuits multiply the phase error by associated factors, which are split into two parts: a loop normalizing gain (MEM_ALPHA set to $\alpha$) and the DCO normalization gain (MEM_GAIN set to $f_R/\hat{K}_{DCO}$). Although the DCO normalizing multipliers belong to the nDCO layer, they can be physically combined with the loop gain multipliers at GP, GA and GT. The outputs of the gain circuits constitute the oscillator tuning word OTW. These outputs, namely, TUNE_P, TUNE_A, TUNE_TI and TUNE_TF, are respectively input to the oscillator control circuits OP, OA, OTI and OTF.

Figure 13A:
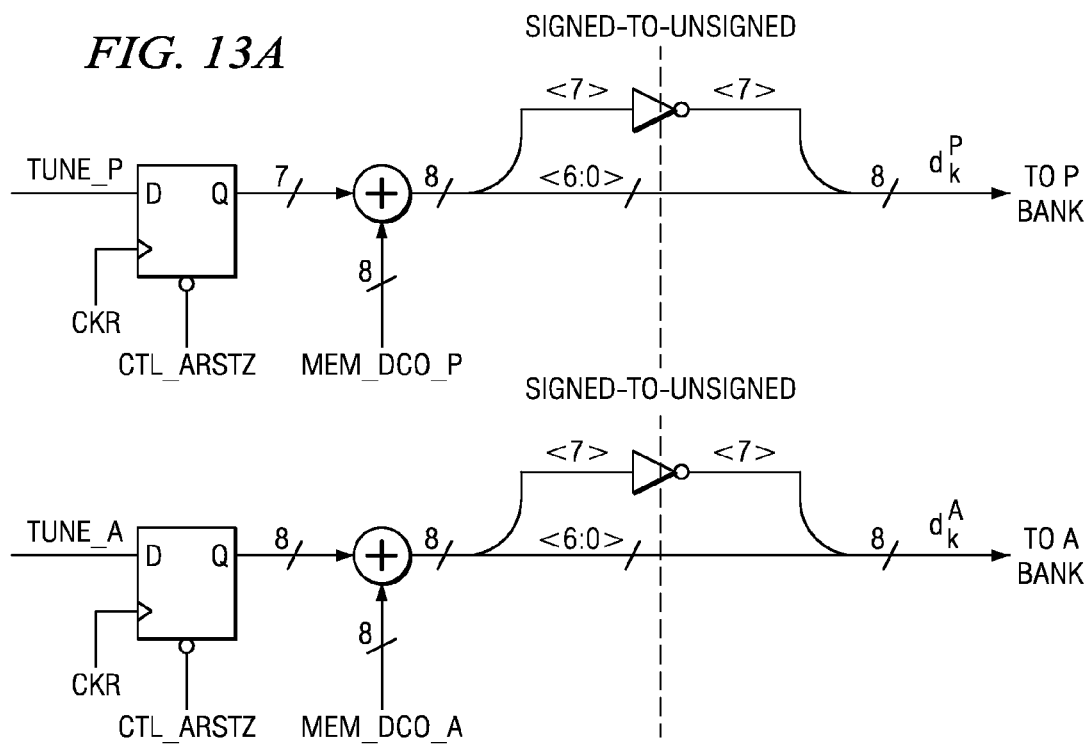
FIG. 13A illustrates portions of FIG. 13 in more detail.

The PVT and acquisition oscillator interfaces OP and OA are shown in FIG. 13A. Both capacitor banks are built as 8-bit binary-weighted arrangements. In some embodiments, $d_k^P$ and $d_k^A$ are expressed as unsigned numbers, but TUNE_P and TUNE_A are provided in a signed 2's complement notation. The appropriate conversion can be implemented by simply inverting the MSB as shown. In this scheme, $-2^7 \ldots 0 \ldots (2^7-1)$ maps to $0 \ldots 2^7 \ldots (2^8-1)$, so the "MSB inversion" could be thought of as an addition of $+2^7$ to the 8-bit 2's complement signed number with the carry outs disregarded. The inverters can be omitted in embodiments where no conversion is needed.

The register memory words MEM_DCO_P and MEM_DCO_A could represent, for example, the last frequency estimate from a look-up table in order to speed up the loop operation. At reset, the DCO can be placed at the center of the operational frequency range (possibly redefined by MEM_DCO_P and MEM_DCO_A) through an asynchronous clear (CTL_ARSTZ) of the tuning word registers. This prevents the oscillator from failing to oscillate if the random power-up values of the tuning word registers set it above the oscillating range, which might happen at the slow process corner.

During the active mode of operation, the new tuning word is latched by the register with every clock cycle. Upon the DCO operational mode change-over (e.g., PVT-to-acquisition), the last stored value of the tuning word is maintained by the register. Consequently, during regular operation, only one path of FIG. 13 can be active at a given time, whereas the previously executed modes maintain their final DCO control states.

The tracking bits of the DCO oscillator need a much greater care and attention to detail than the PVT and acquisition bits. The main reason is that these very bits are used during the normal operation. The PVT and acquisition bits, on the other hand, are used in the preparatory steps to quickly establish the center of the operating frequency and are inactive during the normal operation when the synthesized frequency is used. Consequently, any phase noise or spurious tone contribution of the tracking bits will degrade the synthesizer performance.

Figure 14:
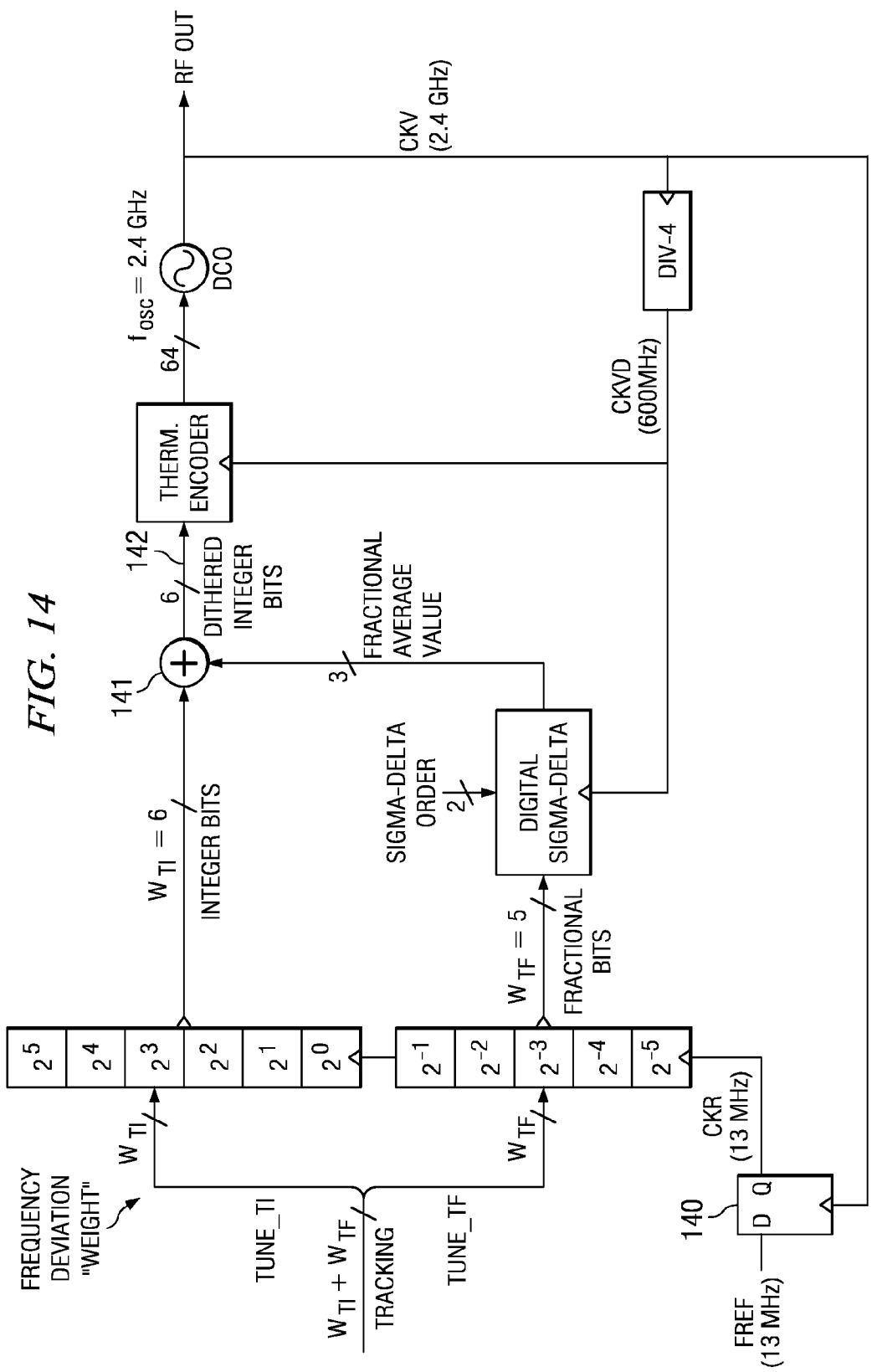
FIG. 14 diagrammatically illustrates an example of the oscillator tracking portion of FIG. 13.

FIG. 14 shows one way to increase frequency resolution of the DCO. In this example, as in FIG. 13, the tracking part of the oscillator tuning word (OTW) is split into two components: integer bits TUNE_TI and fractional bits TUNE_TF. TUNE_TI has $W_{TI}$ bits ($W_{TI}$=6 in the examples of FIGS. 13 and 14) and TUNE_TF has $W_{TF}$ bits ($W_{TF}$=5 in the examples of FIGS. 13 and 14). The LSB of the integer part corresponds to the basic frequency resolution of the DCO oscillator. The integer part could be thermometer encoded to control the same-size DCO varactors of the LC-based tank oscillator. In this scheme, all the varactors are unit weighted but their switching order is predetermined. This guarantees monotonicity and helps to achieve an excellent linearity, especially if their switching order agrees with the physical layout. The transients are minimized since the number of switching varactors is no greater than the code change. This compares very favorably with the binary-weighted control, where a single LSB code change can cause all the varactors to toggle. In addition, due to equal load throughout for all bits, the switching time is equalized in response to code changes. In one implementation, a slightly more general unit-weighted capacitance control is used to add some extra coding redundancy which lends itself to various algorithmic improvements of the system operation, as described below.

The fractional part TUNE_TF employs a time-averaged dithering mechanism to further increase the frequency resolution. The dithering is performed by a digital $\Sigma\Delta$ modulator that produces a high-rate integer stream whose average value equals the lower-rate fractional input.

Figure 15:
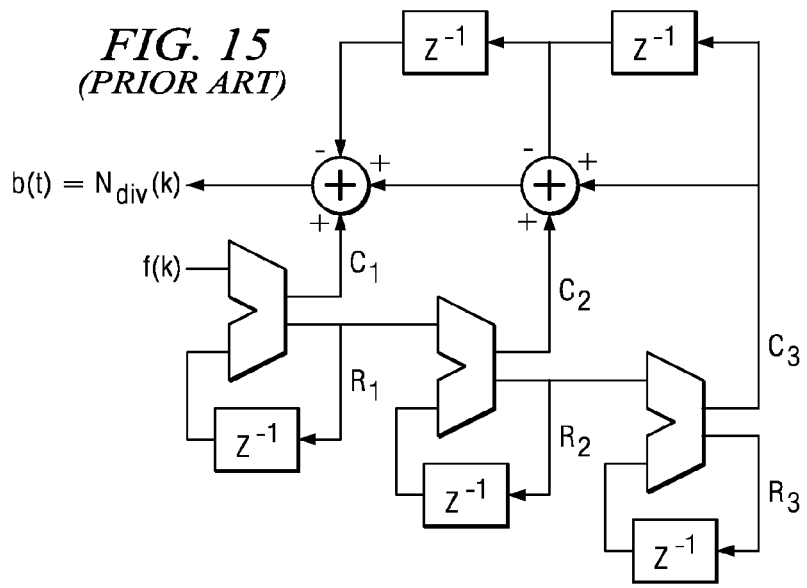
FIG. 15 illustrates a sigma-delta modulator according to the prior art.

$\Sigma\Delta$ techniques have been used successfully for over two decades in the field of analog data converters. This has developed a rich body of knowledge for other applications to draw upon. FIG. 15 shows a conventional third order $\Sigma\Delta$ digital modulator divider. It uses three accumulator stages in which the storage is performed in the accumulator feedback path. The modulator input is a fractional fixed-point number and its output is a small integer stream. The transfer function is $$N_{div}(z) = f(z) + (1-z^{-1})^3 E_{q3}(z) \tag{21}$$

where $E_{q3}$ is the quantization noise of the third stage, and it equals the output of the third stage accumulator. The first term is the desired fractional frequency, and the second term represents noise due to fractional division.

Referring to FIG. 14, the integer part TUNE_TI is added at 141 to the integer-valued high-rate-dithered fractional part. The resulting binary signal at 142 is thermometer encoded to drive sixty-four tracking bank varactors. In this embodiment, the high-rate fractional part is arithmetically added to the low-rate integer part thus making its output (as well as the entire signal path terminating at the varactors inside the DCO) high rate.

In some embodiments, the ΣΔ modulator is built as a third-order MESH-type structure that could be efficiently scaled down to a lower order. It is clocked by CKVD (e.g., 600 MHz obtained by dividing down CKV).

Dithering trades sampling rate for granularity. As an example, if the frequency resolution of the 2.4 GHz DCO is $\Delta f^T = 23$ kHz with a 13 MHz update rate (see FREF and CKR in FIG. 14), then the effective time-averaged frequency resolution, within one reference cycle, after a 600 MHz ΣΔ dither with five sub-LSB bits would be $\Delta f^{T-\Sigma\Delta} = 23$ kHz/$2^5 = 718$ Hz. The frequency resolution improvement achieved here is $2^5 = 32$. This roughly corresponds to the sampling rate speedup of 600 MHz/13 MHz=26.

Figure 16:
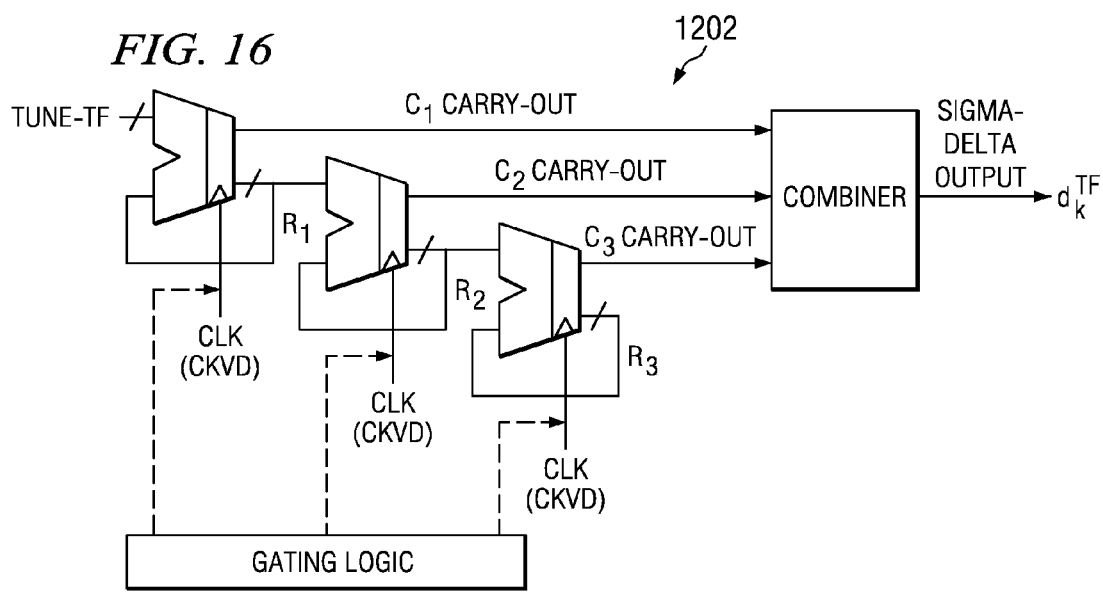
FIG. 16 diagrammatically illustrates a sigma-delta modulator according to the invention.

The structure of an exemplary digital ΣΔ modulator according to the invention is depicted in FIG. 16. This example is a $3^{rd}$ order MESH-type architecture. Since the structure is highly modular, the lower-order modulation characteristics can be set by disabling the tail accumulators through gating off the clock CKVD, which is advantageous from a power saving standpoint. Such gating can be implemented by suitable gating logic (e.g., controlled by a programmable register) as shown diagrammatically by broken line in FIG. 16.

The combiner circuit (originally shown in FIG. 15) merges the three single-bit carry-out streams such that the resulting multi-bit output satisfies the $3^{rd}$ order ΣΔ spectral property. An exemplary $3^{rd}$ order ΣΔ stream equation is shown below $$\text{out}_{\Sigma\Delta} = C_1 \cdot D^3 + C_2 \cdot (D^2 - D^3) + C_3 \cdot (D - 2D^2 + D^3) \quad (22)$$

Where $D \equiv z^{-1}$ is a delay element operation. This equation is easily scaled down to the second or first order ΣΔ by disregarding the third or third and second terms, respectively.

Figure 17A:
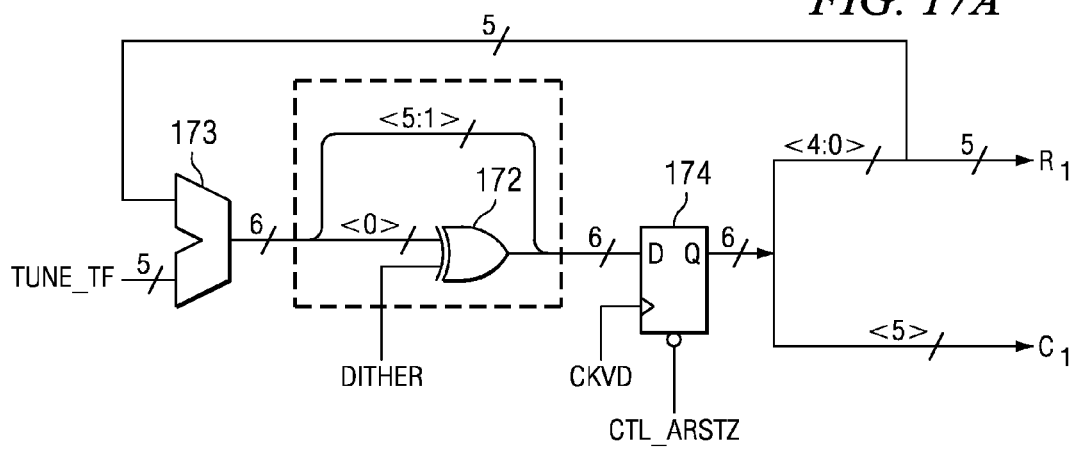
FIG. 17A diagrammatically illustrates exemplary embodiments of a first stage of the sigma-delta modulator of FIGS. 16 and 17.
Figure 17:
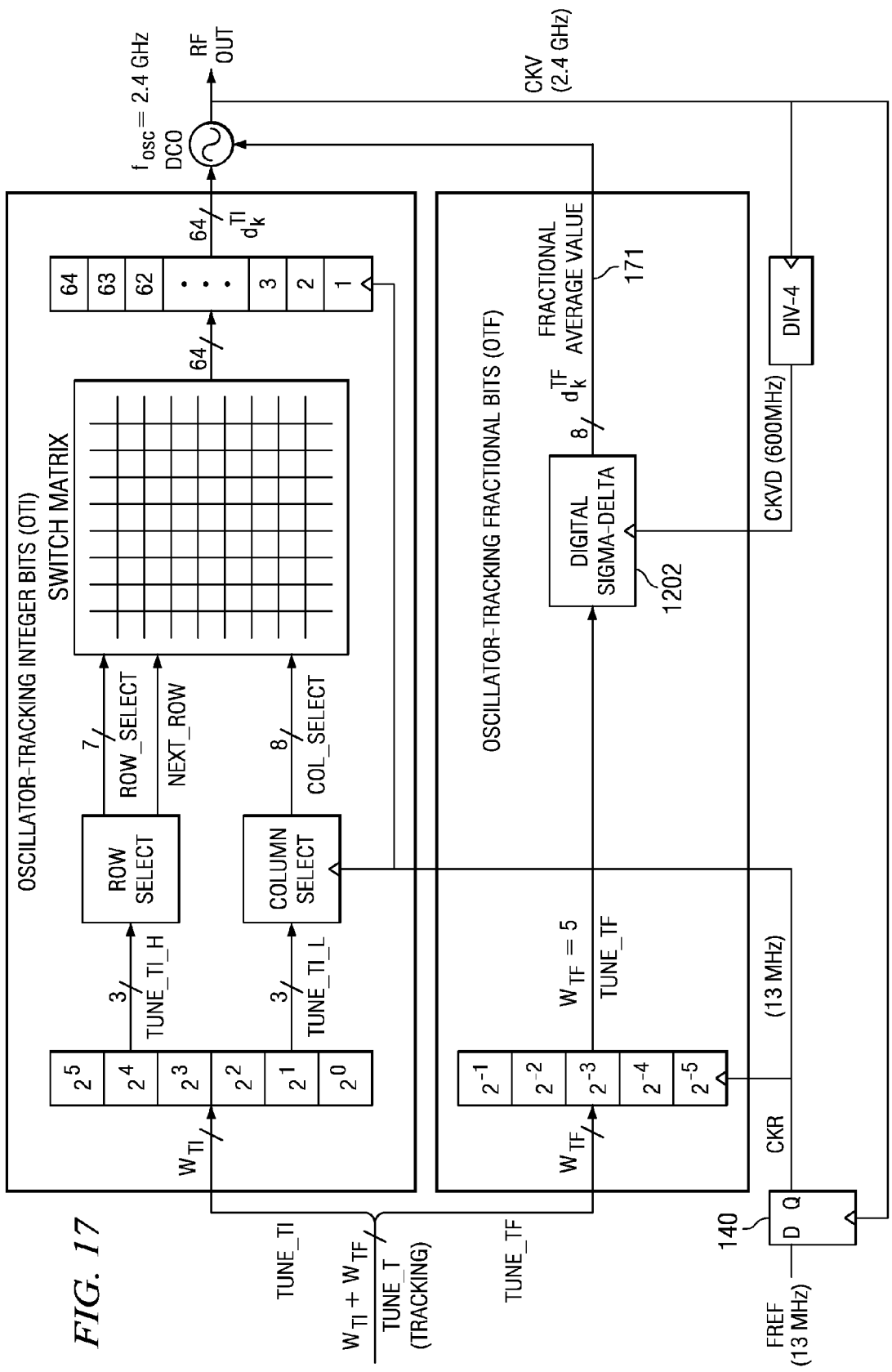
FIG. 17 diagrammatically illustrates exemplary embodiments of the oscillator tracking portion of FIG. 13.

FIG. 17 shows an implementation block diagram of exemplary embodiments of the OTI and OTF portions of FIG. 13. FIG. 17 implements the integer and fractional oscillator tracking control (OTI and OTF of FIG. 13) from a lower power standpoint. The fractional path (TUNE_TF) of the DCO tracking bits, which undergoes high-rate dithering, is entirely separated from the lower-rate integer part (TUNE_TI). The fractional path has a dedicated DCO input at 171 to avoid "contaminating" the rest of the tracking bits with frequent transitions. The switch matrix, together with the row and column select logic, operates as a binary-to-unit-weight (e.g., thermometer) encoder in response to the integer part of the tracking tuning word. The ΣΔ modulator operates on only the fractional part of the tracking tuning word. The actual merging of both the integer and fractional parts is performed inside the oscillator through time-averaged capacitance summation at the LC tank (see also FIGS. 11 and 13).

Figure 18:
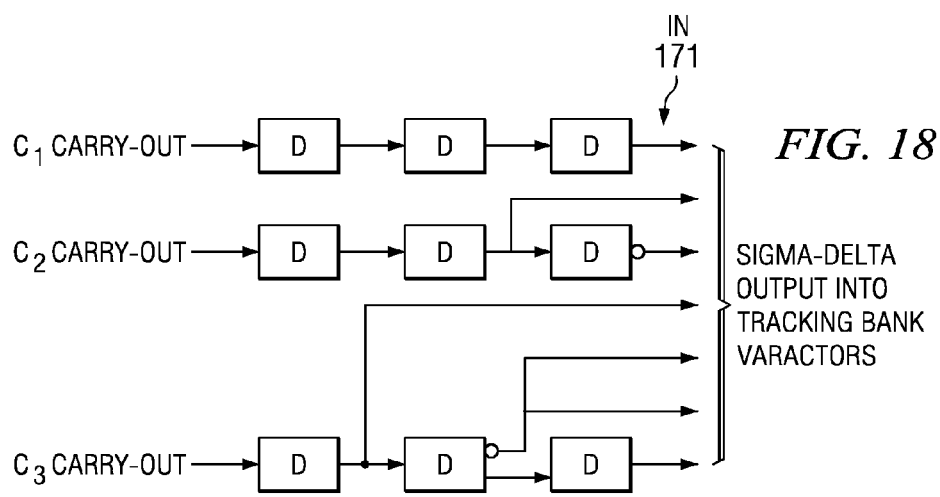
FIG. 18 diagrammatically illustrates exemplary embodiments of the combiner of FIGS. 16 and 17.

One benefit of the FIG. 17 embodiment is that the high-speed arithmetic operation of the Equation 22 combiner is now trivial. FIG. 18 illustrates an exemplary ΣΔ modulator carry-out combiner structure for implementing Equation 22 above. All that is required are flip-flop registers or other suitable delay elements for the delay operations at D, with complementary outputs or other inversion functionality as needed for the negation. The arithmetic addition is performed inside the oscillator through capacitance summation (see also FIGS. 11 and 13). The subtraction operations in Equation 22 can be changed to addition operations, and the complementary outputs (which correspond to subtraction in Equation 22) can be eliminated in FIG. 18 by choosing the corresponding varactors (i.e., the varactors that are driven by complementary outputs in FIG. 18) to have a varactor characteristic (see also FIG. 2) that is the opposite of the varactors driven by non-inverted signals in FIG. 18. This would simplify the combiner structure of FIG. 18, because only delay elements are then needed.

FIG. 19 is a simulation plot using second-order MESH-type ΣΔ modulation of the fractional part TUNE_TF of the tracking tuning word TUNE_T. In this example, the tuning word TUNE_T includes the six integer bits TUNE_TI and the five fractional bits TUNE_TF, and is clocked at the 13 MHz reference frequency (see also FIG. 17). The ΣΔ modulates the five-bit fractional part at 600 MHz clock rate and outputs an integer stream (see $d_k^{TF}$ at 171 in FIG. 17) for use in controlling the DCO frequency. The lower plot shows the ΣΔ output stream $d_k^{TF}$ "merged" with the 6-bit integer part stream $d_k^{TI}$. For the purposes of visualization only, the $d_k^{TI}$ stream is mathematically decoded into an unsigned number representation and added to the mathematically decoded $d_k^{TF}$ signed stream. A running average of the lower plot faithfully reproduces TUNE_T.

Referring again to FIG. 17, in some embodiments, the digital sigma-delta modulator portion used at 1202 for sub-LSB dithering may not have enough bits to establish a repetition cycle long enough to avoid spurious tones at the DCO output. This situation can be addressed by the exemplary embodiment of FIG. 17A. In particular, FIG. 17A illustrates an example of the first stage of the digital sigma-delta modulator portion 1202 of FIG. 17, which modulator portion 1202 can include multiple stages (e.g., 2 or 3, or more). As shown in FIG. 17A, the LSB is exclusive-ORed with a dithering signal at 172, between the input accumulator 173 and the output flip-flops 174. The dithering signal can be produced in any desired manner, for example, by a conventional random number generator, such as a linear feedback shift register. This single-bit randomization in the first stage of the digital sigma-delta modulator portion 1202 helps eliminate the aforementioned spurious tones.

Turning now to phase detection, let the actual clock period of the variable (VCO, DCO or a generally-controllable oscillator) output CKV be $T_V$ and let the clock period of the frequency reference FREF be $T_R$. Assuming that the oscillator runs appreciably faster than the available reference clock, $T_V \ll T_R$, such that the generated RF carrier is orders of magnitude higher in frequency than the reference. In order to simplify the initial analysis, assume also that the actual clock periods are constant or time-invariant.

The CKV and FREF clock transition timestamps $t_V$ and $t_R$, respectively (see FIG. 21), are governed by the following equations:

$$t_V = i \cdot T_V \quad (23)$$

$$t_R = k \cdot T_R + t_0 \quad (24)$$

where i=1, 2, ... and k=1, 2, ... are the CKV and FREF clock transition index numbers, respectively, and $t_0$ is some initial time offset between the two clocks, which is absorbed into the FREF clock.

It is convenient in practice to normalize the transition timestamps in terms of actual $T_V$ units (referred to as unit intervals, UI) since it is easy to observe and operate on the actual CKV clock events. So define dimensionless variable and reference "phases" as follows.

$$\theta_V \equiv \frac{t_V}{T_V} \quad (25)$$

-continued $$\theta_R \equiv \frac{t_R}{T_V} \quad (26)$$

The term $\theta_V$ is only defined at CKV transitions and indexed by i. Similarly, $\theta_R$ is only defined at FREF transitions and indexed by k. This results in $$\theta_V(i)=i \quad (27)$$

$$\theta_R(k) = k \cdot \frac{T_R}{T_V} + \frac{t_0}{T_V} = k \cdot N + \theta_0 \quad (28)$$

The normalized transition timestamps $\theta_V(i)$ of the variable clock, CKV could be estimated by accumulating the number of significant (rising or falling) edge clock transitions.

$$R_V(i \cdot T_V) = \sum_{t=0}^{i} 1 \quad (29)$$

The normalized transition timestamps $\theta_R(k)$ of the frequency reference clock, FREF, could be obtained by accumulating the frequency command word (FCW) on every significant (rising or falling) edge of the frequency reference clock.

$$R_R(k \cdot T_R) = \sum_{t=0}^{k} FCW \quad (30)$$

FCW is formally defined as the frequency division ratio of the expected variable frequency to the reference frequency.

$$FCW \equiv \frac{E(f_v)}{f_R} \quad (31)$$

The reference frequency $f_R$ is usually of excellent long term accuracy, at least as compared to the frequency $f_V$ of variable oscillator.

Alternatively, FCW could be defined in terms of the division of the two clock periods in the mean sense.

$$FCW \equiv \frac{T_R}{E(T_V)} \quad (32)$$

where $E(T_V) = T_V$ is the average clock period of the oscillator. Equation 31 gives another interpretation of the phase domain operation. The FCW value establishes how many high-frequency CKV clocks are to be contained within one lower-frequency FREF clock. It suggests counting a number of CKV clocks and dividing it by the timewise-corresponding number of FREF cycles in order to get the estimate. It should also be noted here that the instantaneous clock period ratio might be slightly off due to the phase noise effects of the DCO oscillator. However, the long-term value should be very precise and approach FCW in the limit.

FCW control is generally expressed as being comprised of integer ($N_i$) and fractional ($N_f$) parts.

$$FCW=N=N_i+N_f \quad (33)$$

The PLL operation achieves, in a steady-state condition, a zero averaged phase difference between the variable phase $\theta_V(i)$ and the reference phases $\theta_R(k)$. Attempts to formulate the phase error as a unitless phase difference $\phi_E=\theta_R-\theta_V$ would be unsuccessful due to the nonalignment of the time samples.

An additional benefit of operating the PLL loop with phase domain signals is to alleviate the need for the frequency detection function within the phase detector. This allows the PLL to operate as type-I (only one integrating pole due to the DCO frequency-to-phase conversion), where it is possible to eliminate a low-pass filter between the phase detector and the oscillator input, resulting in a high bandwidth and fast response of the PLL. It should be noted that conventional phase-locked loops such as a charge-pump-based PLL do not truly operate in the phase domain. There, the phase modeling is only a small-signal approximation under the locked condition. The reference and feedback signals are edge based and their closest distance is measured as a proxy for the phase error. Deficiencies, such as false frequency locking, are direct results of not truly operating in the phase-domain.

The two clock domains described above are entirely asynchronous, so it is difficult to physically compare the two digital phase values at different time instances $t_V$ and $t_R$ without metastability problems. (Mathematically, $\theta_V(i)$ and $\theta_R(k)$ are discrete-time signals with incompatible sampling times and cannot be directly compared without some sort of interpolation.) Therefore, the digital-word phase comparison should be performed in the same clock domain. This is achieved in some embodiments by over-sampling the FREF clock by the high-rate DCO clock, CKV (see, e.g., 140 in FIGS. 14 and 17, and using the resulting CKR clock to accumulate the reference phase $\theta_R(k)$ as well as to synchronously sample the high-rate DCO phase $\theta_V(k)$, mainly to contain the high-rate transitions. FIG. 20 illustrates the concept of synchronizing the clock domains by retiming the frequency reference (FREF). Since the phase comparison is now performed synchronously at the rising edge of CKR, Equations 27 and 28 can be re-written as follows.

$$\theta_V(k)=k \quad (34)$$

$$\theta_R(k)=k \cdot N+\theta_0+\epsilon(k) \quad (35)$$

The set of phase estimate equations (Equation 29 and Equation 30) should be augmented by the sampled variable phase.

$$\sum_{t=0}^{i} 1, \text{ at } iT_v = kT_R \quad (36)$$

The index k of Equation 36 is the kth transition of the retimed reference clock CKR, not the kth transition of the reference clock FREF. By constraint, each CKR cycle contains an integer number of CKV clock transitions. In Equation 35, $\epsilon(k)$ is the CKV clock edge quantization error, in the range of $\epsilon \in (0,1)$, that could be further estimated and corrected by other means, such as a fractional error correction circuit. This operation is graphically illustrated in FIG. 21 as an example of integer-domain quantization error for a simplified case of the frequency division ratio of $$N = 2\frac{1}{4}.$$

Unlike $\epsilon(k)$, which represents rounding to the next DCO edge, conventional definition of the phase error represents rounding to the closest DCO edge and is shown as $\phi(k)$ in FIG. 22.

The reference retiming operation (shown in FIG. 20 and at 140 in FIGS. 14 and 17) can be recognized as a quantization in the DCO clock transitions integer domain, where each CKV clock rising edge is the next integer and each rising edge of FREF is a real-valued number. If the system is to be time-causal, only quantization to the next DCO transition (next integer), rather than the closest transition (rounding-off to the closest integer), could realistically be performed.

Because of the clock edge displacement as a result of the retiming, the CKR clock is likely to have an instantaneous frequency different from its average frequency.

Conventionally, phase error is defined as the difference between the reference and variable phases. Here, a third term will be added to augment the timing difference between the reference and variable phases by the $\epsilon$ correction.

$$\phi_E(k) = \theta_R(k) - \theta_V(k) + \epsilon(k) \tag{37}$$

Additionally, dealing with the units of radian is not useful here because the system operates on the whole and fractional parts of the variable clock cycle and true unitless variables are more appropriate.

The initial temporary assumption about the actual clock periods being constant or time-invariant could now be relaxed at this point. Instead of producing a constant ramp of the detected phase error $\phi_E$, the phase detector will now produce an output according to the real-time clock timestamps.

The phase error can be estimated in hardware by the phase detector operation defined by $$\phi_E(k) = R_R(k) - R_V(k) + \epsilon(k) \tag{38}$$

It is possible to rewrite Equation 38 in terms of independent integer and fractional parts such that the integer part of the reference phase $R_{R,i}$ is combined with the integer-only $R_V$, and the fractional part of the reference phase $R_{R,f}$ is combined with the fractional-only $\epsilon$.

$$\phi_E(k) = [R_{R,i}(k) - R_V(k)] + [R_{R,f}(k) + \epsilon(k)] \tag{39}$$

In light of the above equation, the fractional error correction $\epsilon$ is to track the fractional part of the reference phase $R_{R,f}$, which is similar in operation to the variable phase $R_V$ tracking the integer part of the reference phase $R_{R,i}$. Therefore, the three-term phase detection mechanism performs dual phase error tracking, with separate paths for the integer and fractional parts. The fractional-term tracking should be contrasted with the integer-term tracking due to the apparently different arithmetic operations. The former is complement-to-1 tracking (both fractional terms should ideally add to one), whereas the latter is 2's complement tracking (both terms should ideally subtract to zero). The not-so-usual application of the unsigned 2's complement operation (complement-to-1) is a result of the $\epsilon$ definition and has no implications on circuit complexity. Even the resulting bias of one is easily absorbed by the variable phase accumulator.

Figure 23:
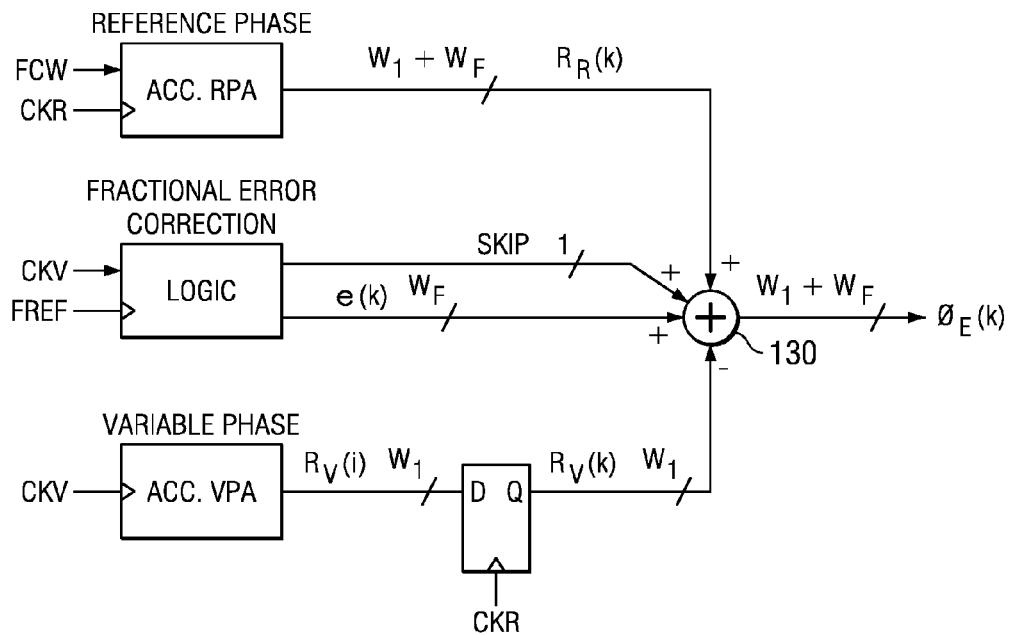
FIG. 23 diagrammatically illustrates a phase detection apparatus according to the invention.

FIG. 23 illustrates a general block diagram of exemplary embodiments of the phase detection mechanism of Equation 38. It includes the phase detector 130 itself, which operates on the three phase sources: reference phase $R_R(k)$, variable phase $R_V(k)$ and the fractional error correction $\epsilon(k)$. An extra bit ("skip" bit) from the fractional error correction is for metastability avoidance and will be explained below. The actual variable phase $R_V(i)$ is clocked by the CKV clock of index i and is resampled by the CKR clock of index k to produce $R_V(k)$. Due to this resampling, all three phase sources input to phase detector 130 are synchronous to the CKR clock, which guarantees that the resulting phase error $\phi_E(k)$ is also synchronous.

Figure 24:
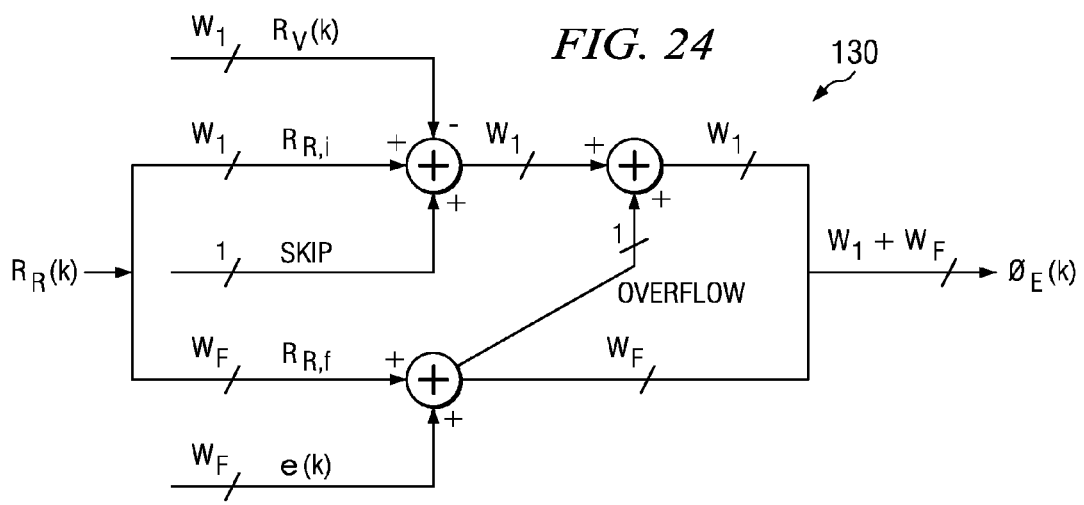
FIG. 24 diagrammatically illustrates exemplary embodiments of the phase detector of FIG. 23.

FIG. 24 shows an example of the internal structure of the phase detector circuit 130. All inputs are synchronous. The integer and fractional parts of the reference phase signal $R_R(k)$ are split and processed independently with proper bit alignment. The integer portion uses modulo arithmetic in which $W_I$-width rollovers are expected as a normal occurrence.

Figure 25:
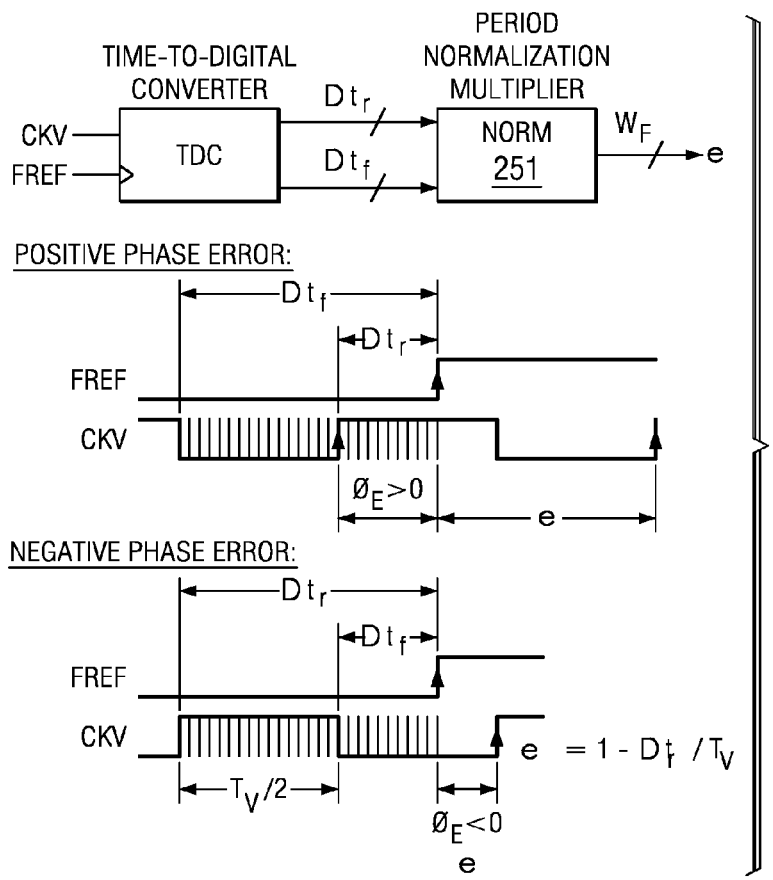
FIG. 25 illustrates the structure and operation of the fractional error correction logic of FIG. 23.

Due to the DCO edge counting nature of the PLL, the phase quantization resolution of the integer precision configuration cannot be better than ±½ of the DCO clock cycle. For wireless applications, a finer phase resolution might be required. This must be achieved without forsaking the digital signal processing capabilities. FIG. 25 shows how the integer-domain quantization error $\epsilon(k)$ gets corrected by means of fractional error correction. The fractional (sub-$T_V$) delay difference $\epsilon$ between the reference clock and the next significant edge of the DCO clock is measured using a time-to-digital converter (TDC) with a time quantization resolution of an inverter delay $t_{inv}$. The time difference is expressed as a fixed-point digital word. This operation is shown in FIG. 25.

The TDC output is normalized by the oscillator clock period at 251. A string of inverters is the simplest possible implementation of time-to-digital conversion. In a digital deep-submicron CMOS process, the inverter could be considered a basic precision time-delay cell which has full digital-level regenerative properties. For example, inverter delay $t_{inv}$ is about 30 ps for a typical $L_{eff}$=0.08 μm CMOS process. It should be noted that it is possible for the TDC function to achieve a substantially better resolution than an inverter delay. Using a Vernier delay line with two non-identical strings of buffers, the slower string of buffers can be stabilized by negative feedback through a delay line. The buffer time propagation difference establishes the resolution.

Figure 26:
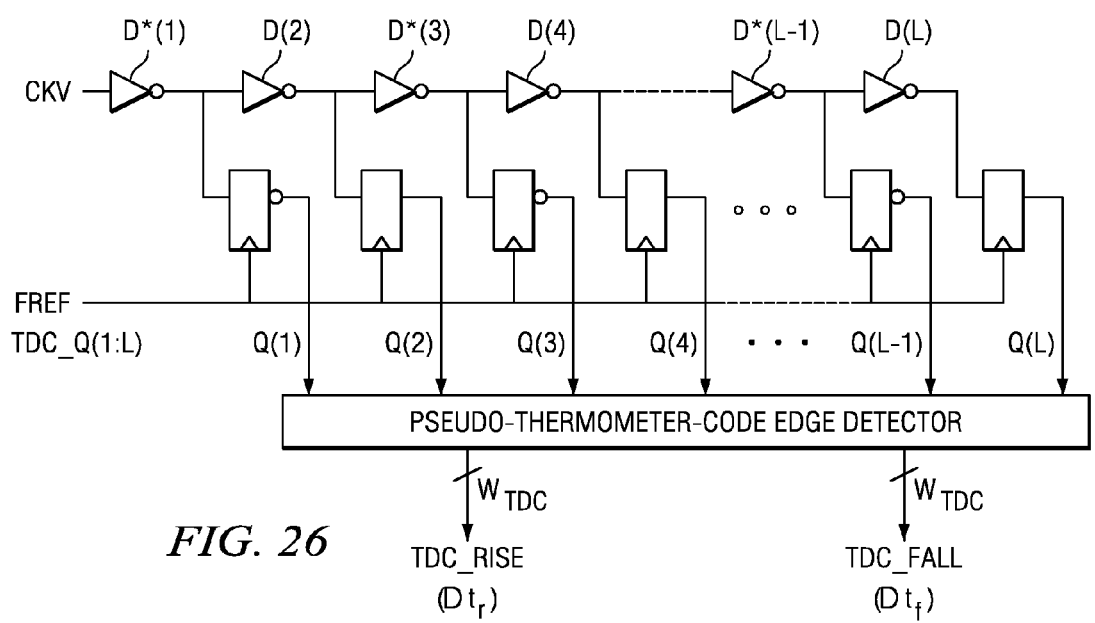
FIG. 26 diagrammatically illustrates exemplary embodiments of the time-to-digital converter of FIG. 25.
Figure 27:
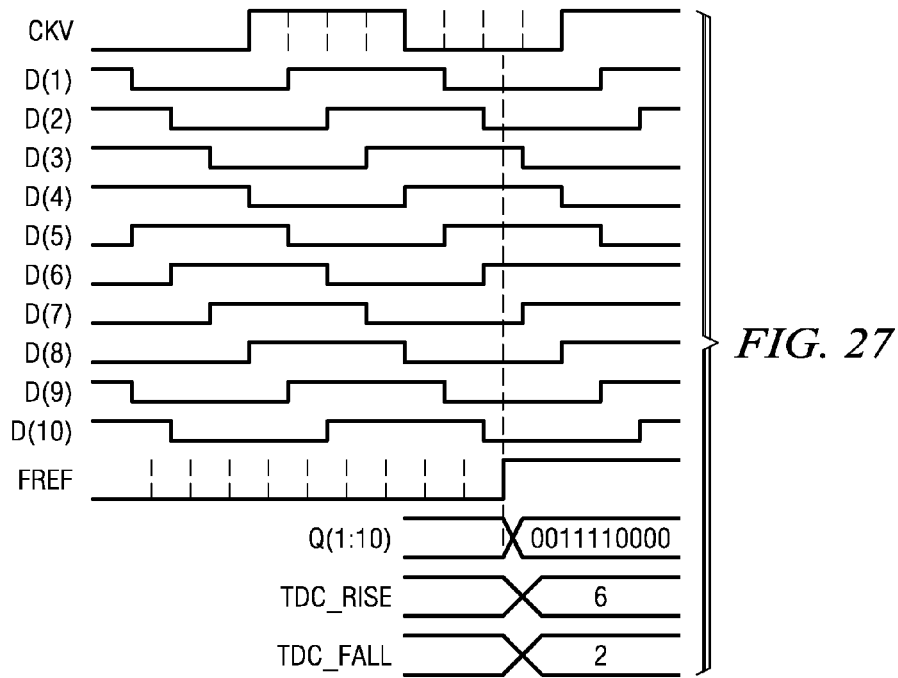
FIG. 27 is a timing diagram which illustrates exemplary operations of the time-to-digital converter of FIG. 26.

FIGS. 26 and 27 illustrate an exemplary Time-to-digital Converter (TDC) in more detail. The digital fractional phase is determined by passing the DCO clock (CKV) through a chain of inverters (see FIG. 26), such that each inverter output would produce a clock slightly delayed than from the previous inverter. The staggered clock phases are then sampled by the same reference clock. This is accomplished by an array of registers, whose Q outputs (alternate ones of which are inverted) form a pseudo-thermometer code TDC_Q. In this arrangement there will be a series of ones and zeros. In the FIG. 27 example, the series of four ones start at position 3 and extend to position 6. This indicates a half-period of $4t_{inv}$, so $T_V=8t_{inv}$. The series of four zeros follow starting at index 7. The position of the detected transition from 1 to 0 would indicate a quantized time delay $\Delta t_r$ (see also FIG. 25) between the FREF sampling edge and the rising edge of the DCO clock, CKV, in $t_{inv}$ multiples. Similarly, the position of the detected transition from 0 to 1 would indicate a quantized time delay $\Delta t_f$ between the FREF sampling edge and the falling edge of the DCO clock, CKV. Because of the time-causal nature of this operation, both delay values must be interpreted as positive. This is fine if $\Delta t_r$ is smaller than $\Delta t_f$ (see also FIG. 25). This corresponds to the positive phase error of the classical PLL in which the reference edge is ahead of the DCO edge and, therefore, the phase sign has to be negated. However, it is not so straightforward if $\Delta t_r$ is greater than $\Delta t_f$ (see also FIG. 25). This corresponds to the negative phase error of the classical PLL. The time lag between the reference edge and the following rising edge of CKV must be calculated based on the available information of the delay between the preceding rising edge of CKV and the reference edge and the clock half-period, which is the difference $T_V/2 = \Delta t_r - \Delta t_f$. In general, $$T_V/2 = \begin{cases} \Delta t_r - \Delta t_f, \text{ for } \Delta t_r \geq \Delta t_f \\ \Delta t_f - \Delta t_r, \text{ otherwise} \end{cases} \quad (40)$$

The number of taps L required for the TDC of FIG. 26 is determined by how many inverters are needed to cover the full DCO period.

$$L \geq \frac{\max(T_v)}{\min(t_{inv})} \quad (41)$$

If too many inverters are used, then the circuit is more complex and consumes more power than necessary. For example, in FIG. 27, inverters 9 and 10 are beyond the first full cycle of eight inverters and are not needed since the pseudo-thermometer decoder/edge detector is based on a priority detection scheme and earlier bits would always be considered first. It is a good engineering practice, however, to keep some margin in order to guarantee proper system operation at the fast process corner and the lowest DCO operational frequency, even if it is below the operational band.

In this implementation, the conventional phase $\phi_E$ is not needed. Instead, $\Delta t_r$ is used for the $\epsilon(k)$ correction of Equation 35 that is positive and $\epsilon \in (0,1)$. It is normalized by dividing it by the clock period (unit interval, UI) and complementing-to-1, in order to properly combine it with the fractional part of the reference phase output $R_{R,i}$. The fractional correction $\epsilon(k)$ is represented as a fixed-point digital word (see also FIG. 25):

$$\varepsilon(k) = 1 - \frac{\Delta t_r(k)}{T_V} \quad (42)$$

The clock period $T_V$ can be obtained through longer-term averaging in order to ease the calculation burden and linearize the transfer function of $1/T_V$. The averaging time constant could be as slow as the expected drift of the inverter delay, possibly due to temperature and supply voltage variations. The instantaneous value of the clock period is an integer but averaging it would add significant fractional bits with longer operations.

$$T_V = \frac{1}{N_{avg}} \sum_{k=1}^{N_{avg}} T_V(k) \quad (43)$$

In one example, accumulating 128 clock cycles produces accuracy within 1 ps of the inverter delay. By making the length of the operation a power of 2, the division by the number of samples $N_{avg}$ can be done with a simple right-shift.

Figure 28:
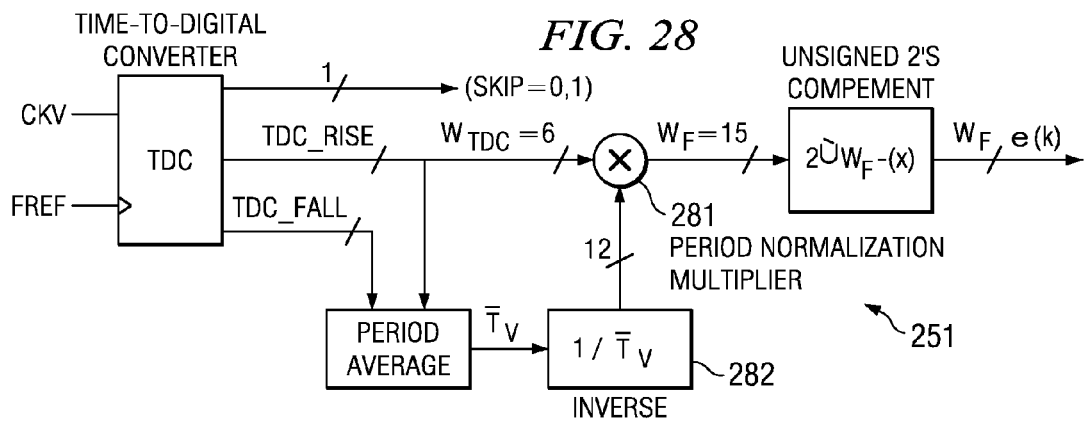
FIG. 28 diagrammatically illustrates exemplary embodiments of the normalizer of FIG. 25.
Figure 28A:
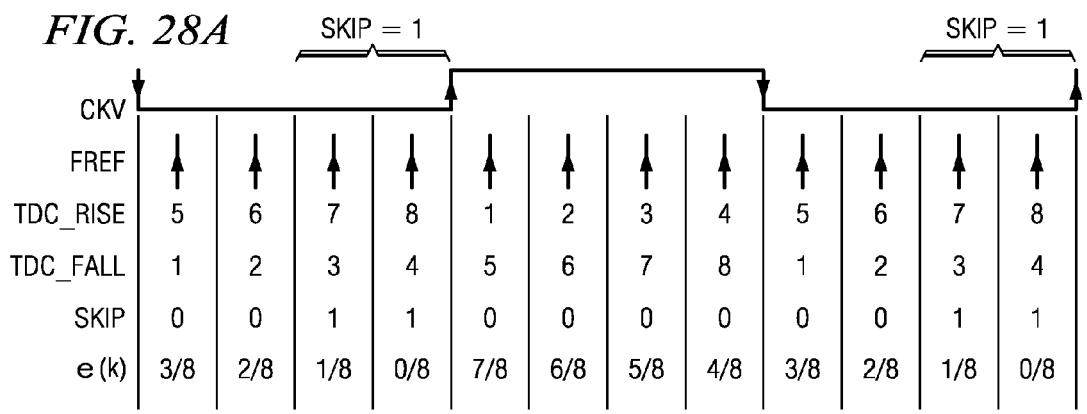
FIG. 28A is a timing diagram which illustrates the "skip" signal of FIGS. 23, 24 and 28.

FIG. 28 illustrates exemplary TDC normalization and edge-skipping operations. The actual fractional output of the $\epsilon$ error correction utilizes one extra bit ("skip") due to the fact that the whole CKV cycle would have to be skipped if the rising edge of FREF transitions too close before the rising edge of CKV. As a safety precaution, the falling CKV edge would have to be used, and that is always resampled by the following rising edge of CKV. The "skip" bit is of the integer LSB weight (see also FIG. 24). This scenario is illustrated in FIG. 28A in which there is a full-cycle skipping if FREF happens as close as two inverter delays before the rising edge of CKV.

In wireless communications, CKV is typically much faster than FREF. FREF (created, e.g., by an external crystal) is at most a few tens of MHz, and CKV (RF carrier) is in the GHz range. In one embodiment, $f_R$=13 MHz and $f_V$=2.4-2.8 GHz, resulting in the division ratio N in the range of 180. The large value of N puts more emphasis on the CKV edge counting operation (Equation 29), which is exact, and less emphasis on the $\epsilon$ determination (TDC operation), which is less precise due to the continuous-time nature of device delays. The invention also permits the N ratio to be much smaller. In general, the resolution of the fractional error correction is typically at least an order of magnitude better than the CKV period.

TDC_RISE and TDC_FALL in FIGS. 26-28A are small integer quantizations of the $\Delta t_r$ and $\Delta t_f$ time delays, respectively. They are outputs of the edge detector of FIG. 26. In one embodiment, the TDC_Q bus width is 48, so 6 bits are required by TDC_RISE and TDC_FALL to represent the decoded data.

In one example implementation of the TDC, a symmetric sense-amplifier-based flip-flop with differential inputs is used to guarantee substantially identical delays for rising and falling input data.

Figures 29, 30:
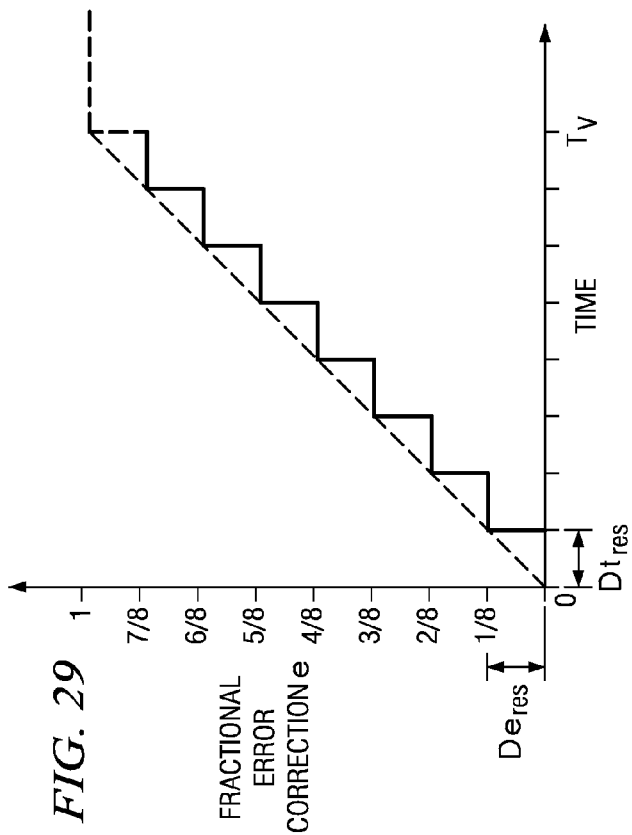
FIG. 29 is a timing diagram which graphically illustrates the quantization effects associated with the fractional error correction logic of FIGS. 23 and 25-28.
FIG. 30 diagrammatically illustrates a proportionality factor which relates a phase error signal to a normalized tuning word according to the invention.

In a conventional PLL, the phase detector is, at least theoretically, a linear device whose output is proportional the timing difference between the reference and the feedback oscillator clock. In the all-digital implementation of the invention, the $\epsilon$ fractional phase error correction is also linear but is quantized in $\Delta t_{res}$ time units, where $\Delta t_{res} \approx t_{inv}$. FIG. 29 shows an example of the quantization effects of the $\epsilon$ transfer function of Equation 42. The TDC quantum step $\Delta t_{res}$ determines the quantum step of the normalized fractional error correction which is expressed as $\Delta \epsilon_{res} = \Delta t_{res}/T_V$ in normalized units. The transfer function has a negative bias of $\Delta t_{res}/2$ but it is inconsequential since the loop will compensate for it automatically.

The purpose of the phase detection mechanism is to convert the accumulated timing deviation TDEV, which is a pure time-domain quantity, into a digital bit format. At the same time, as the TDC transfer function in FIG. 29 confirms, the phase detector is to perform the output normalization such that TDEV=$T_V$ corresponds to unity.

Under these circumstances, the phase detector output $\phi_E$ could be interpreted as a frequency deviation estimator (from a center or "natural" frequency) of the output CKV clock, which estimator is normalized to frequency reference $f_R$. Within one reference clock cycle, $T_R = 1/f_R$, $$\hat{\Delta f}_V = \phi_E \cdot f_R \quad (44)$$

The above estimate increases linearly with the number of reference cycles.

The resolution of the phase detector is directly determined by the TDC resolution, $\Delta \phi_{E,res} = \Delta \epsilon_{res}$. Adopting the frequency estimation view of the phase detector, the quantum step in the $f_V$ frequency domain, per reference cycle, would be $$\Delta f_{PD,res} = \Delta\varepsilon_{res} \cdot f_R = \left(\frac{\Delta t_{res}}{T_V}\right) \cdot f_R = \left(\frac{\Delta t_{res}}{T_V}\right) \cdot \frac{1}{T_R} \quad (45)$$

For example, assuming $\Delta t_{res}$=30 ps, $f_V$=2.4 GHz and $f_R$=13 MHz, the resulting frequency estimate quantization level of a single FREF cycle is $f_{V,res}$=935 kHz. However, because the frequency is a phase derivative of time, the frequency resolution could be enhanced with a longer observation period, i.e., over multiple FREF cycles. In this case, Equation 45 could be modified by multiplying $T_R$ by the number of FREF cycles.

A steady-state phase error signal according to the invention also indicates the steady state frequency offset from the center DCO frequency. Note that the tuning word OTW directly sets the DCO operating frequency and there is a proportionality factor between the normalized tuning word (NTW) and the phase error $\phi_E$, as shown at 301 in FIG. 30. Consequently, the steady-state frequency offset could be expressed as $$\Delta f_V = \phi_E \cdot \alpha \cdot f_R \quad (47)$$

Equation 47 should be contrasted with Equation 44, which is only a single reference cycle estimate that is a part of the detection process. Equation 47 could also be explained from another perspective. If a sudden frequency deviation $\Delta f_V$ occurs at the output, then in one FREF cycle the phase detector will estimate the frequency deviation per Equation 44. This will correct the DCO frequency by $\Delta f_V \cdot \alpha$. In the second reference cycle, the detected frequency at the phase detector will be $\Delta f_V(2-\alpha)$ leading to the DCO correction of $\Delta f_V(2-\alpha) \cdot \alpha$. This process of geometric sequence will continue until the DCO frequency gets fully corrected, and the phase detector develops the $\Delta f_V/\alpha$ offset.

Figure 31:
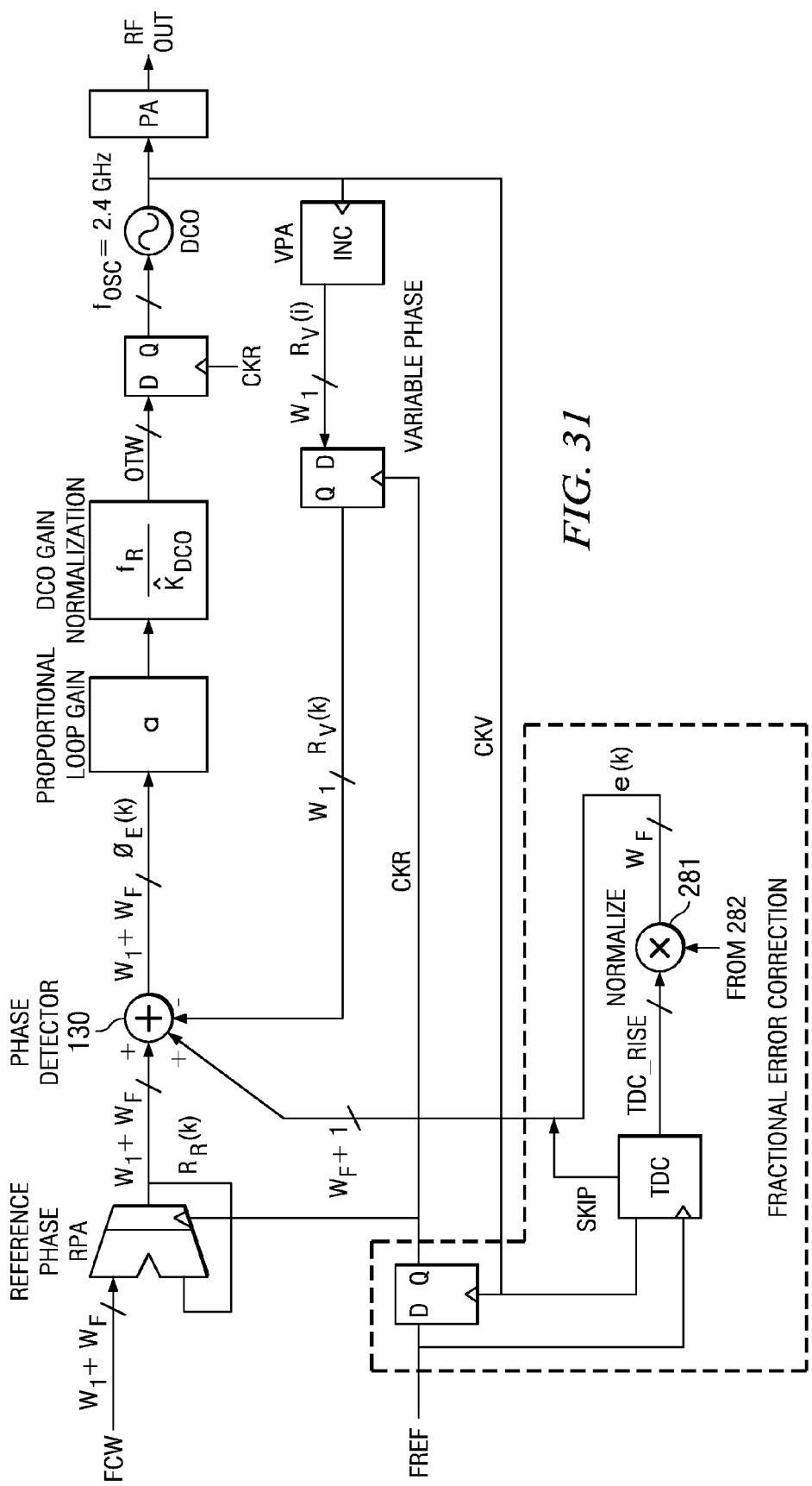
FIGS. 31 and 32 diagrammatically illustrate exemplary embodiments of an all digital frequency synthesizer according to the invention.

Exemplary phase-domain all-digital synchronous PLL synthesizer embodiments according to the invention are illustrated in FIG. 31. The PLL loop is a fixed-point phase-domain architecture whose purpose is to generate an RF frequency, for example, an RF frequency in the 2.4 GHz unlicensed band for the BLUETOOTH standard. The underlying frequency stability of the system is derived from a frequency reference FREF crystal oscillator, such as a 13 MHz temperature-compensated crystal oscillator (TCXO) for the GSM system.

One advantage of keeping the phase information in fixed-point digital numbers is that, after conversion to the digital domain, the phase information cannot be further corrupted by noise. Consequently, in some embodiments, the phase detector is realized as an arithmetic subtractor that performs an exact digital operation.

It is advantageous to operate in the phase domain for several reasons, examples of which follow. First, the phase detector is an arithmetic subtractor that does not introduce any spurs into the loop as would a conventional correlative multiplier. Second, the phase domain operation is amenable to digital implementations, in contrast to conventional approaches. Third, the dynamic range of the phase error can be arbitrarily increased simply by increasing the wordlength of the phase accumulators. This compares favorably with the conventional implementations, which typically are limited only to $\pm 2\pi$ of the compare frequency with a three-state phase/frequency detector. Fourth, the phase domain allows algorithmically higher precision than operating in the frequency domain, since the frequency is a time derivative of phase, and a certain amount of phase quantization (such as in TDC) decreases its frequency error with the lapse of time.

Figure 32:
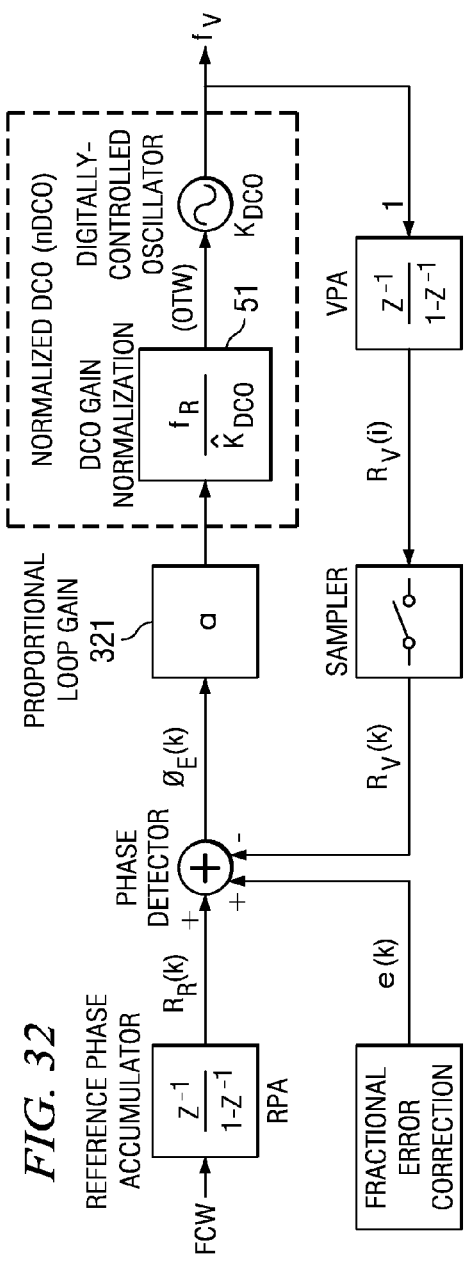

FIG. 32 shows exemplary embodiments of a phase-domain ADPLL architecture according to the invention from a different perspective. The central element is the 2.4 GHz digitally-controlled oscillator (DCO), and the PLL loop built around it is fully digital and of type-I (i.e., only one integrating pole due to the DCO frequency-to-phase conversion). Type-I loops generally feature faster dynamics and are used where fast frequency/phase acquisition is required or direct transmit modulation is used. The loop dynamics are further improved by avoiding the use of a loop filter. The issue of the reference feedthrough that affects classical charge-pump PLL loops and shows itself as spurious tones at the RF output is irrelevant here because, as discussed before, a linear, and not a correlation phase detector is used.

In addition, unlike in type-II PLL loops, where the steady-state phase error goes to zero in the face of a constant frequency offset (i.e., frequency deviation between the actual and center DCO frequencies), the phase error in type-I PLL loop is proportional to the frequency offset. However, due to the digital nature of the implementation, this does not limit the dynamic range of the phase detector or the maximum range of the DCO operational frequency.

The normalized proportional loop gain multiplier 321 feeds the nDCO. The normalized proportional loop gain constant $\alpha$ (corresponding to the "MEM_ALPHA" values of FIG. 13) is a programmable PLL loop parameter that controls the loop bandwidth. It represents the amount of phase attenuation expected to be observed at the phase detector output in response to a certain change in the phase detector output at the previous reference clock cycle.

The PLL loop is a synchronous all-digital phase-domain architecture that arithmetically compares the accumulated FCW (i.e., $R_R(k)$ from the reference phase accumulator) with the DCO clock edge count (i.e., $R_V(k)$ from the variable phase accumulator) in order to arrive at the phase error correction. The FCW input to the reference accumulator RPA is used to establish the operating frequency of the desired channel and it is expressed in a fixed-point format such that 1 LSB of its integer part corresponds to the reference frequency $f_R$. FCW could also be viewed as a desired frequency division ratio $$\frac{f_V}{f_R}.$$

Alternatively, FCW indicates the real-valued count of the DCO clock cycle periods $T_V$ per cycle $T_R$ of the reference clock.

A non-linear differential term could be added to the phase-domain ADPLL synthesizer of FIG. 32. Due to its noise-enhancement property, the differential term has to be filtered in a non-linear manner. This could be accomplished by a differential gain controller including a thresholder circuit 331 (shown in FIG. 33) that senses the phase error difference 335 between the current and previous samples (obtained from a subtractor that combines those samples) and activates a DCO correction for large phase error steps. The differential term is useful to handle situations in which an occasional rapid frequency perturbation occurs during the regular tracking operation when the PLL loop is settled and normally slower in response. The threshold can be set high enough to avoid being triggered by the expected distribution of thermal and flicker noise.

The aforementioned sudden changes in the oscillating frequency might be due to, for example, a sudden supply voltage drop when the integrated digital baseband starts a new activity. Relying on the proportional loop gain term to handle the sudden perturbation would normally require a relatively long time due to the narrow loop bandwidth. In order to filter out any transitory phase error perturbations, which might not necessarily indicate a consistent change in the oscillating frequency, the new phase error can be qualified for a number of clock cycles.

Figure 33:
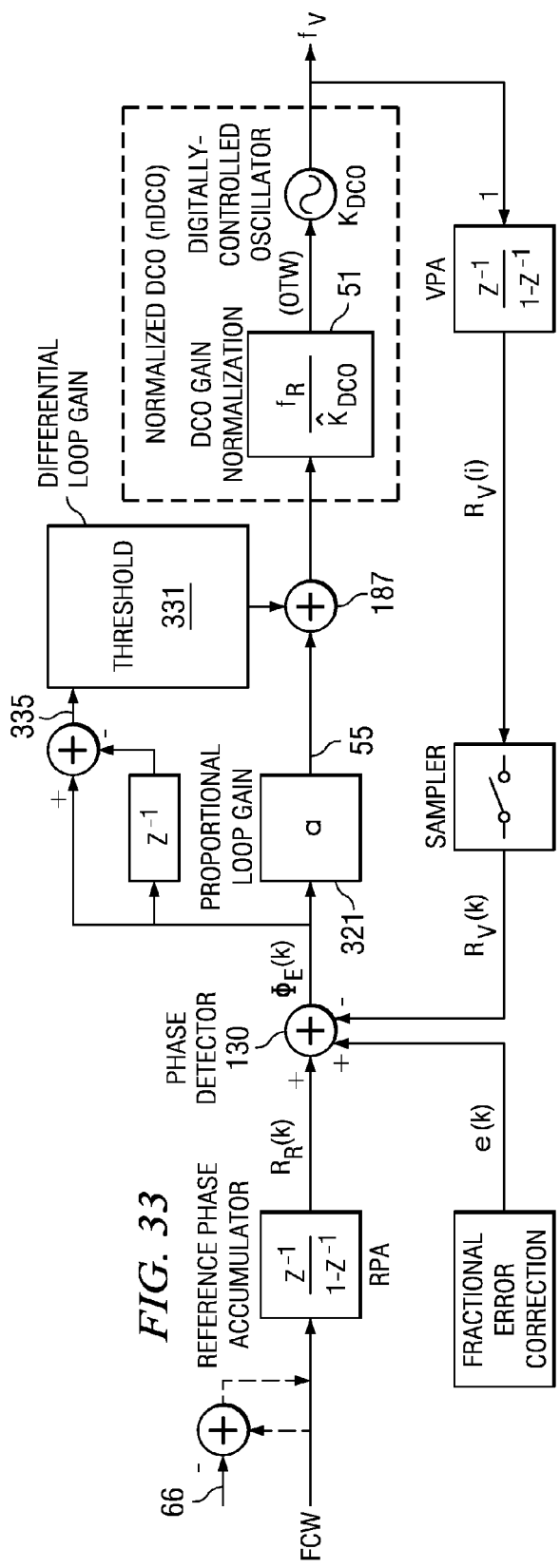
FIG. 33 diagrammatically illustrates exemplary embodiments of an all digital frequency synthesizer according to the invention including a differential gain controller for handling frequency perturbations.
Figure 33A:
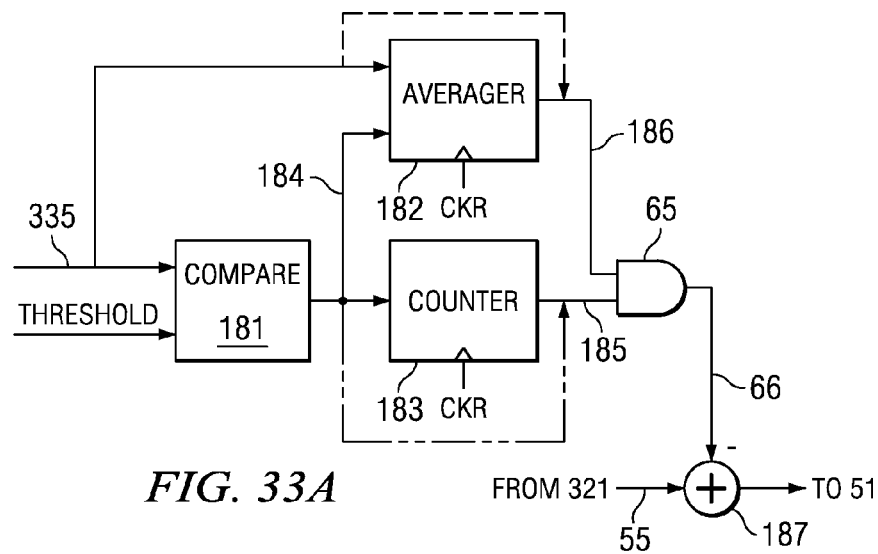
FIG. 33A diagrammatically illustrates exemplary embodiments of the gain controller of FIG. 33.

FIG. 33A diagrammatically illustrates exemplary embodiments of an all-digital frequency synthesizer including a differential gain controller according to the present invention. The aforementioned phase error difference 335 is input to a comparator 181, along with a predetermined threshold value. If the phase error difference at 335 exceeds the threshold value, the comparator 181 activates a signal 184 which enables a counter 183 and an averager 182, both of which are clocked by CKR. The averager computes a running average of the sequence of phase error difference values that occur while the enable signal 184 is active. The counter 183 counts the number of CKR cycles which occur while the enable signal 184 is active. If the counter counts a predetermined number of CKR cycles while the enable signal 184 is active, the counter 183 activates its output 185, which is coupled to an input of an AND gate 65. The other input of AND gate 65 is coupled to an output 186 of the averager 182. The output 186 provides a digital signal indicative of the current running average calculated by the averager 182. The output 185 of counter 183 thus qualifies the averager output at AND gate 65. The counter 183 can be designed to qualify the averager output 186 only after the phase error difference 335 exceeds the threshold for a predetermined number of CKR cycles (e.g. 4 or 5 cycles). In this manner, transitory phase error perturbations, which might not necessarily indicate a consistent change in the oscillating frequency, can be filtered out. If the counter 183 determines that the phase error perturbation is not merely a transitory occurrence, then the averager output 186 is qualified at AND gate 65, whose output 66 is subtracted at 187 from the output 55 of the loop gain multiplier 321 (see also FIG. 33). The result of the subtraction is input to the DCO gain normalization multiplier 51.

The threshold value of FIG. 33A can be determined, for example, empirically, based on experimentation and/or simulations under expected operating conditions and in view of desired performance. In some embodiments, the averager is omitted, as shown by broken line in FIG. 33A. In other embodiments, both the counter and averager are omitted, as shown by broken and chain lines in FIG. 33A.

Figure 33B:
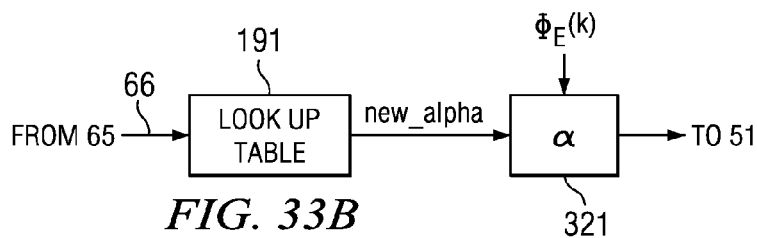
FIG. 33B diagrammatically illustrates further exemplary embodiments of the gain controllers of FIGS. 33 and 33C.

In another exemplary embodiment, as illustrated in FIG. 33B, the output 66 of AND gate 65 in FIG. 33A can be used to access a new_alpha value from a lookup table 191. This new_alpha value is provided directly to the loop gain multiplier 321 (see also FIG. 33). This new_alpha value replaces the existing alpha value of the loop gain multiplier 321, thereby addressing the detected phase error perturbation.

Figure 33C:
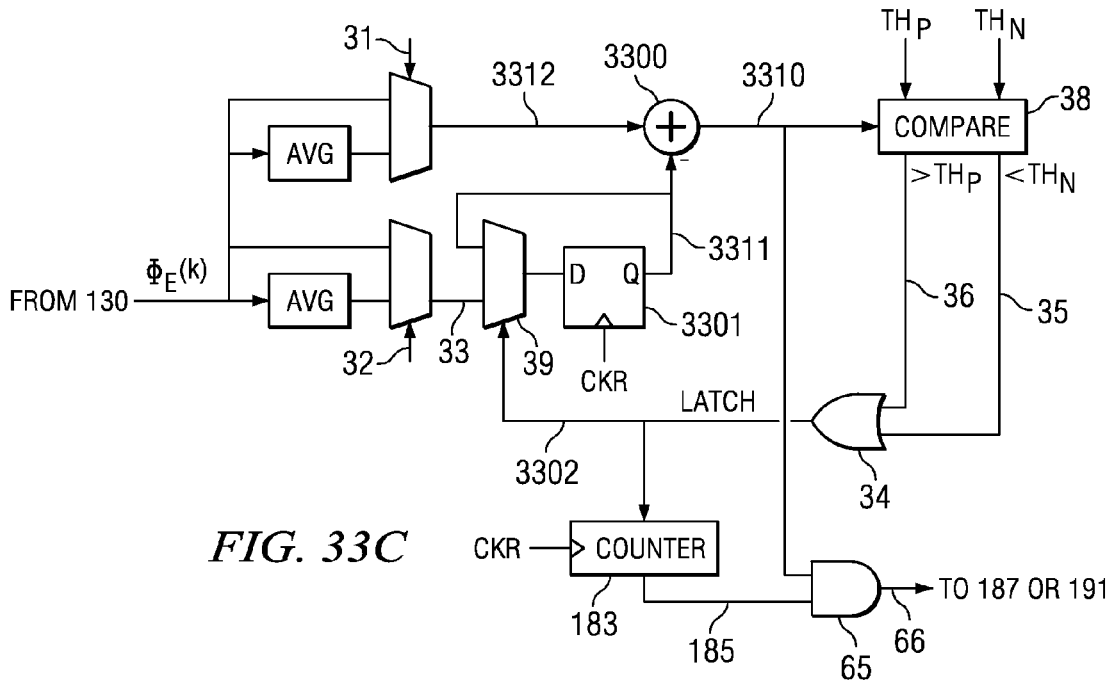
FIG. 33C diagrammatically illustrates further exemplary embodiments of a differential gain controller according to the invention.

FIG. 33C diagrammatically illustrates further exemplary embodiments of an all-digital frequency synthesizer including a differential gain controller according to the invention. The embodiments of FIG. 33C can produce the same phase error difference 335 as is produced by the embodiments of FIG. 33, if the selectors at 31 and 32 are controlled to select their upper inputs and the selector 39 is controlled to select its lower input 33. If the flip-flop 3301 inserts a single CKR clock cycle delay, the subtractor at 3300 produces at 3310 the aforementioned phase error difference signal 335 of FIG. 33.

Also, the embodiments of FIG. 33C provide a latching function at 39 and 3301. When the latch signal 3302 is active, the selector 39 selects its upper input, thereby cooperating with the flip-flop 3301 to latch the last phase error value received at 33. The latch signal 3302 is driven by an OR gate 34 whose inputs are driven by respective output signals 35 and 36 of a comparator 38. One input of the comparator 38 is driven by the output 3310 of subtractor 3300, and the comparator 38 also receives a positive threshold value $TH_P$ and a negative threshold value $TH_N$. The output signal 35 of the comparator 38 is activated when the output 3310 of subtractor 3300 is less than the negative threshold, and the output signal 36 of comparator 38 is activated when the output 3310 of subtractor 3300 is greater than the positive threshold. The latch signal 3302 is activated when either of the comparator output signals 35 or 36 is activated. Thus, in the illustrated embodiments, as long as the value at 3310 is outside of the range of values between and including the upper and lower threshold values, the value at 3311 remains latched.

The latch signal 3302 also enables counter 183, which counts the number of CKR cycles that occur while the latch signal 3302 is active. If the counter 183 counts a predetermined number of CKR cycles while the latch signal 3302 is active, then the counter 183 activates its output 185, which is coupled to an input of AND gate 65, whose other input is driven by the output 3310 of subtractor 3300. The output 185 of counter 183 thus qualifies the signal 3310 at AND gate 65. The output 66 of AND gate 65 can be subtracted at 187 from the output 55 of the loop gain multiplier 321 (see also FIG. 33) or, in other embodiments, the output 66 can be applied to the look-up table 191 of FIG. 33B.

The gain controller of FIG. 33C also includes averagers AVG which can be selected by selectors 31 and 32 such that the input 33 of selector 39 and the input 3312 of subtractor 3300 can be driven by digital values which are average values of the phase error over a desired period of time. In such averaging embodiments, the average value provided at 3311 will be delayed relative to the average value provided at 3312 by at least one CKR cycle.

In general, the amount of time by which the value at the 3311 is delayed relative to the value at 3312 is determined by the behavior of the latch signal 3302.

Figure 33D:
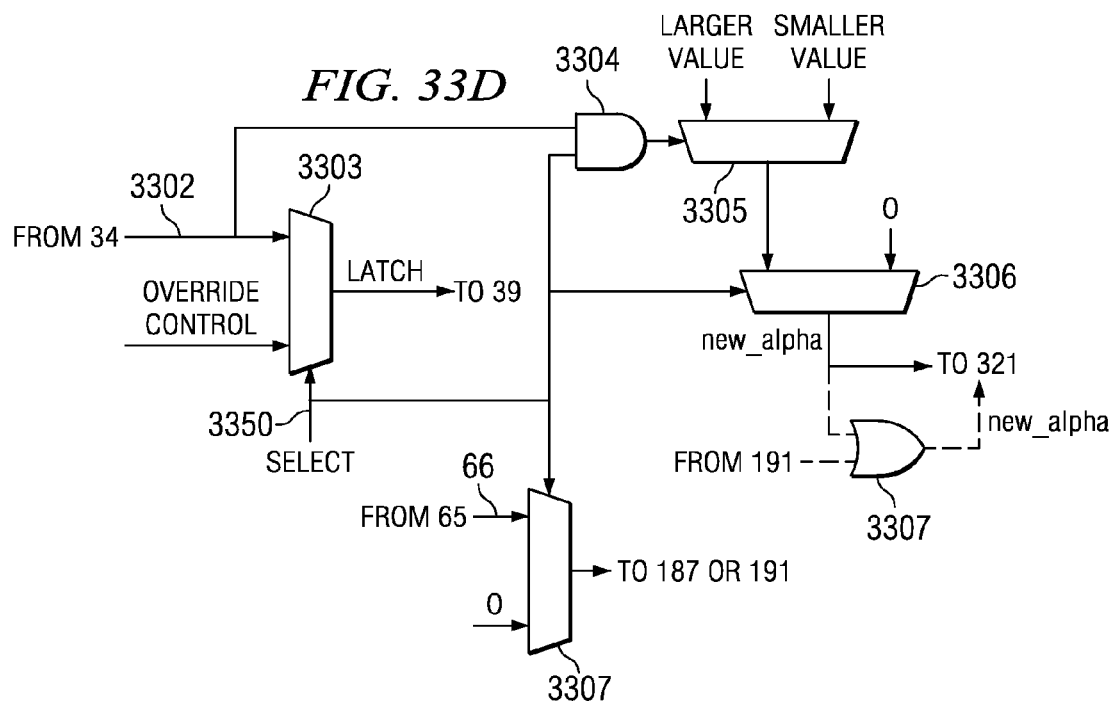
FIG. 33D diagrammatically illustrates further exemplary embodiments of a differential gain controller according to the invention.

FIG. 33D diagrammatically illustrates further exemplary embodiments of a differential gain controller according to the invention, including an override feature that permits smaller frequency perturbations to be addressed. For example, when the frequency synthesizer is operating in the steady-state condition just before the transition at 371 in FIG. 37, the select signal 3350 of FIG. 33D can be driven active, thereby permitting the latch signal at the select input of selector 39 in FIG. 33C to be driven from an override control input (via selector 3303), rather than from the output 3302 of the OR gate 34. In order to effectively utilize the override feature of FIG. 33D to address smaller (and often more gradual) frequency perturbations, the positive and negative threshold values $TH_P$ and $TH_N$ of FIG. 33C should be reduced enough to permit detection of, and appropriate response to, smaller frequency perturbations.

When the select signal 3350 is active in FIG. 33D, the negating input of subtractor 187 (see FIGS. 33 and 33A), or the input of look-up table 191 (see FIG. 33B) in other embodiments, is driven by logic zero rather than by the output 66 of AND gate 65. Also when the select signal is active, the output 3302 of OR gate 34 is qualified at AND gate 3304, thereby permitting the output of OR gate 34 to control a selector (look-up table) 3305. Activation of the select signal 3350 also controls selector 3306 to pass the output from 3305 to the proportional loop gain multiplier 321 (see also FIGS. 33 and 33B). If either of the signals 35 and 36 of FIG. 33C is active, then the signal 3302 will be active, thereby selecting a larger value to be applied as the new_alpha value for the proportional loop gain multiplier 321. If neither of the signals 36 and 35 is activated in FIG. 33C, then the output of AND gate 3304 in FIG. 33D will select the smaller value to be passed as the new_alpha value for the proportional loop gain multiplier 321.

When the select signal 3350 is inactive, then the output 3302 of OR gate 34 drives the latch signal at the select input of selector 39 in FIG. 33C, but is no longer qualified at 3304. Also with the select signal inactivated, the output 66 of AND gate 65 is again selected to drive the negating input of subtractor 187, or the input of the look-up table 191 in other embodiments. Inactivation of the select signal also causes the selector 3306 to pass logic zero to its output.

In exemplary embodiments that utilize both the look-up table 191 of FIG. 33B and the look-up table 3305 of FIG. 33D, the new_alpha signal can be provided to the proportional loop gain multiplier 321 by an OR gate 3307 (shown by broken line in FIG. 33D), one of whose inputs is driven by the output of the look-up table 191, and the other of whose inputs is driven by the output of selector 3306. In such embodiments, when the select signal is activated, the selector 3307 applies logic zero to the look-up table 191, which can be programmed, for example, to produce a logic zero output in response to a logic zero input. Activation of the select signal also causes the selector 3306 to select the output of look-up table 3305, so the output of look-up table 3305 is qualified to pass through the OR gate 3307 to the proportional loop gain multiplier 321. When the select signal is inactivated, the output 66 of AND gate 65 drives the input of the look-up table 191, and the output of look-up table 191 is applied to the OR gate 3307, whose other input is driven by a logic zero selected at 3306 when the select signal is inactive. Therefore, the output of the look-up table 191 is qualified at the OR gate 3307 and is therefore provided to the proportional loop gain multiplier 321.

In exemplary embodiments that utilize the subtractor 187 of FIGS. 33 and 33A, and the look-up table 3305 of FIG. 33D, inactivation of the select signal in FIG. 33D will cause logic zero to be provided (by selector 3306) as new_alpha to the proportional loop gain multiplier 321. The proportional loop gain multiplier 321 can be designed, for example, to ignore a logic zero as its new_alpha input and instead continue using its current value of alpha. The inactive select signal 3350 causes selector 3307 to connect the output 66 of AND gate 65 to the inverting input of subtractor 187.

Referring again to FIG. 33, in some exemplary embodiments (as shown by broken line), the output 66 of the AND gate 65 in any of the above-described embodiments can, in addition to being subtracted from the output 55 of the proportional loop gain multiplier 321, also be subtracted from the frequency command word FCW to produce a modified frequency command word for input to the reference phase accumulator RPA.

As mentioned above, the DCO gain estimate $K_{DCO}$ can be computed by harnessing the power of the existing phase detection circuitry for the purpose of determining the oscillator frequency deviation $\Delta f_V$. The DCO frequency deviation $\Delta f_V$ can be calculated by observing the phase error difference $\Delta \phi_E$ (expressed as a fraction of the DCO clock period) in the observation interval of the phase detector update, which is normally equal to the frequency reference clock period $T_R$. Equation 44 can be written as:

$$\Delta f_V = \frac{\Delta \phi_E}{T_R} = \Delta \phi_E \cdot f_R \qquad (48)$$

Equation 48 can be plugged into Equation 19 to provide an estimated DCO gain.

$$K_{DCO}(f_v, OTW) = \frac{\Delta \phi_E \cdot f_R}{\Delta(OTW)} \qquad (49)$$

Equation 49 theoretically allows calculation of the local value, i.e., for a given DCO input OTW, of the oscillator gain $K_{DCO}$ by observing the phase detector output $\Delta \phi_E$ that occurs in response to the $\Delta(OTW)$ input perturbation at the previous reference clock cycle. The reference frequency $f_R$ is the system parameter which is, for all practical purposes, known exactly.

Unfortunately, and as mentioned previously, the above method of frequency estimation is a poor choice due to the excessive TDC quantization for realistic values of $\Delta t_{res}$. Instead, the difference between the steady-state phase error values is more appropriate. Equation 47 captures the relationship, and $$\Delta f_v = \phi_E \cdot \alpha \cdot f_R \qquad (50)$$

$$\hat{K}_{DCO}(f_v, OTW) = \frac{\phi_E \cdot \alpha \cdot f_R}{\Delta(OTW)} \qquad (51)$$

An advantage in operation can be obtained by noting that in a type-I PLL loop the phase error $\phi_E$ is proportional to the relative oscillating frequency. Consequently, not only the power of the phase detection circuitry could be harnessed but also the averaging and adaptive capability of the PLL loop itself. Equation 49 can be used now with the normal loop updates (unlike the general case) for an arbitrary number of FREF clock cycles. At the end of the measurement, the final $\Delta \phi_E$ and $\Delta OTW$ values are used. The loop itself provides the averaging and frequency quantization reduction.

In some embodiments, the oscillating frequency is dynamically controlled by directly adding the appropriately scaled modulating data $y(k)=FCW_{data}(k)$ to the quasi-static frequency command word $FCW_{channel}$ at the reference phase accumulator input that is normally used for channel selection.

$$FCW(k)=FCW_{channel}(k)+FCW_{data}(k) \qquad (52)$$

where k is the aforementioned discrete-time index associated with FREF.

Figure 34:
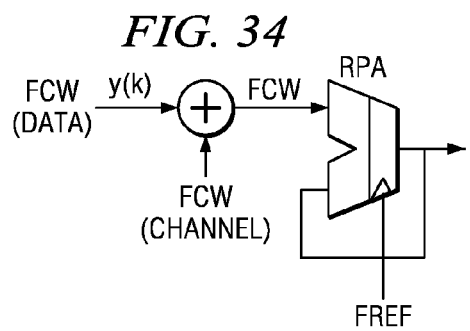
FIG. 34 diagrammatically illustrates exemplary embodiments of an all digital frequency synthesizer of the present invention wherein the oscillating frequency is dynamically controlled by including modulation data in a frequency control word at the input of the reference phase accumulator of FIGS. 30-33.

This idea is depicted in FIG. 34. Introducing the modulating data redefines the FCW, as the expected instantaneous frequency division ratio of the desired synthesizer output to the reference frequency.

$$FCW(k) = \frac{f_v(k)}{f_R} \qquad (53)$$

Figure 35:
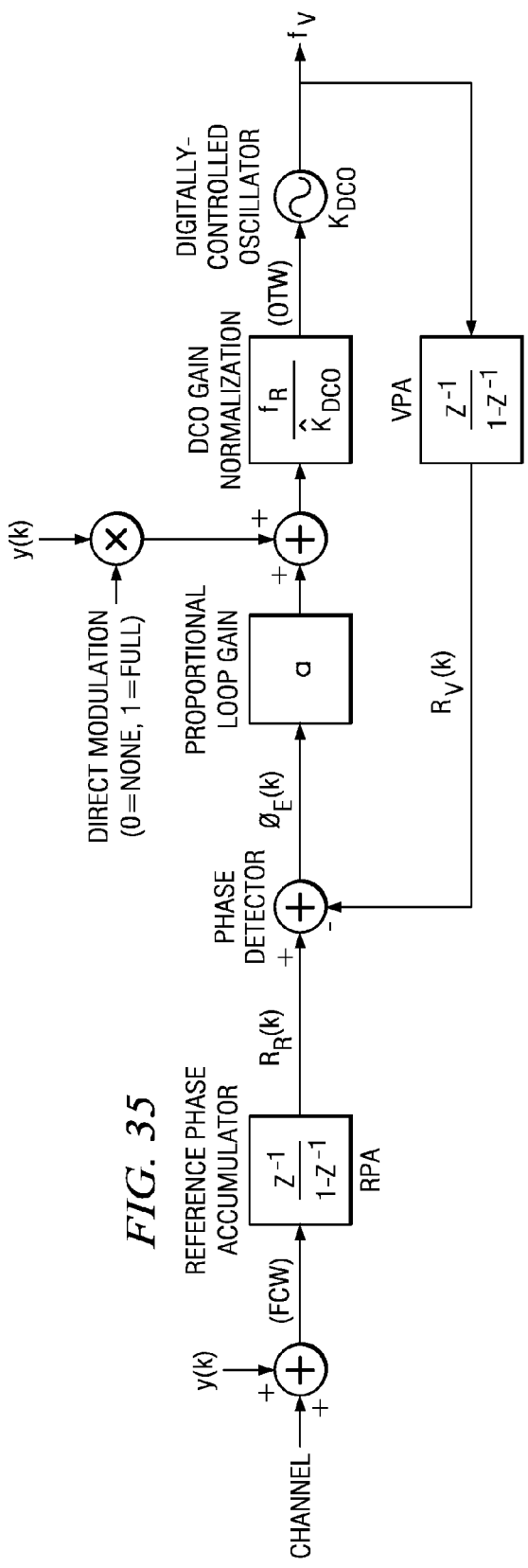
FIG. 35 diagrammatically illustrates exemplary embodiments of an all digital frequency synthesizer with direct oscillator modulation according to the invention.

If the loop parameter α is a fixed-point number or a combination of a few power-of-two numbers, i.e., low resolution mantissa, then the exemplary structure in FIG. 35 can be used. In this configuration, a y(k) direct path feed is combined with the output of the α loop gain multiplier to directly modulate the DCO frequency in a feed-forward manner such that the loop dynamics are effectively removed from the modulating transmit path.

This direct oscillator modulation with the PLL compensating scheme works well in a digital implementation, and very good compensation can be achieved. This scheme would work equally well with a higher order PLL loop.

Figure 36:
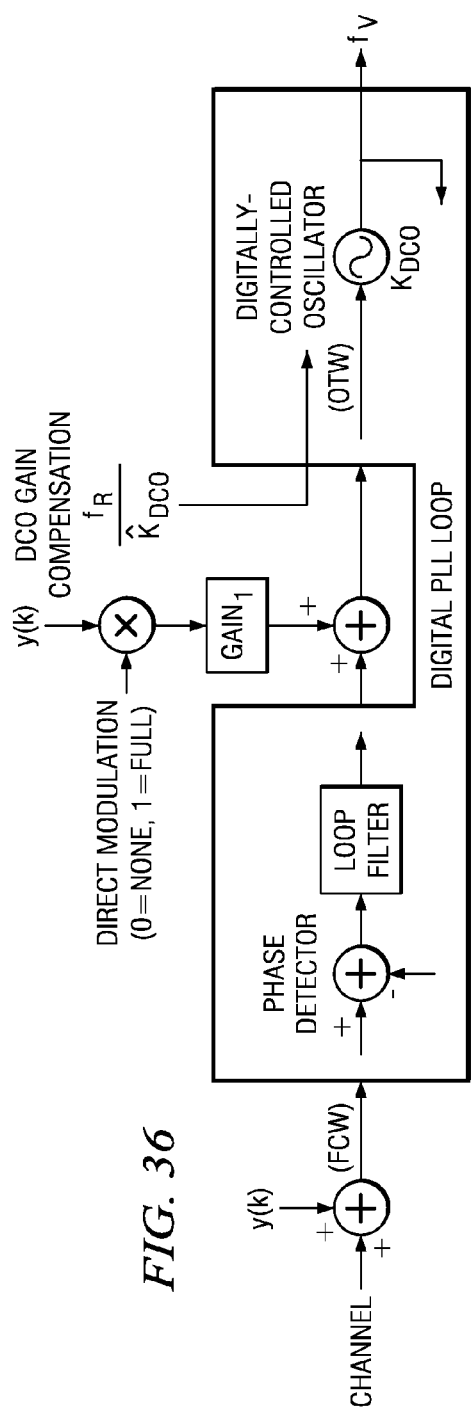
FIG. 36 diagrammatically illustrates the application of direct oscillator modulation to a generalized PLL loop structure.

FIG. 36 shows how the direct oscillator modulation with the PLL loop compensation scheme of FIG. 35 could be applied to a general digital PLL structure. The modulating data y(k) is dynamically added to the channel frequency information in order to affect the frequency or phase of the oscillator output $f_{RF}=f_V$. This could be accomplished, for example, by controlling the frequency division ratio of a fractional-N PLL loop. The direct modulation structure is inserted somewhere between the loop filter and the oscillator. Gain of the direct modulating path from y(k) to the oscillator input should be $$\frac{f_R}{\hat{K}_{DCO}}$$

if y(k) is expressed as the unitless fractional division ratio.

In some embodiments of the invention, the estimation of $K_{DCO}$ (first mentioned above with respect to Equation 17) can be conveniently and just-in-time calculated at the beginning of every packet. As mentioned above, the gain $K_{DCO}$ could be estimated as the ratio of the forced oscillating frequency deviation $\Delta f_V$ to the observed steady-state change in the oscillator tuning word $\Delta(OTW)$:

$$\hat{K}_{DCO}(f v) = \frac{\Delta f_v}{\Delta(OTW)} \quad (54)$$

$\hat{K}_{DCO(fv)}$ is actually used in the denominator of the DCO gain normalization multiplier:

$$\frac{f_R}{\hat{K}_{DCO}(fv)} = \frac{f_R}{\Delta fv} \cdot \Delta(OTW) \quad (54A)$$

This is quite beneficial since the unknown OTW is in the numerator and the inverse of the forced $\Delta f_v$ is known and could be conveniently precalculated. This way, use of dividers is avoided.

Figure 37:
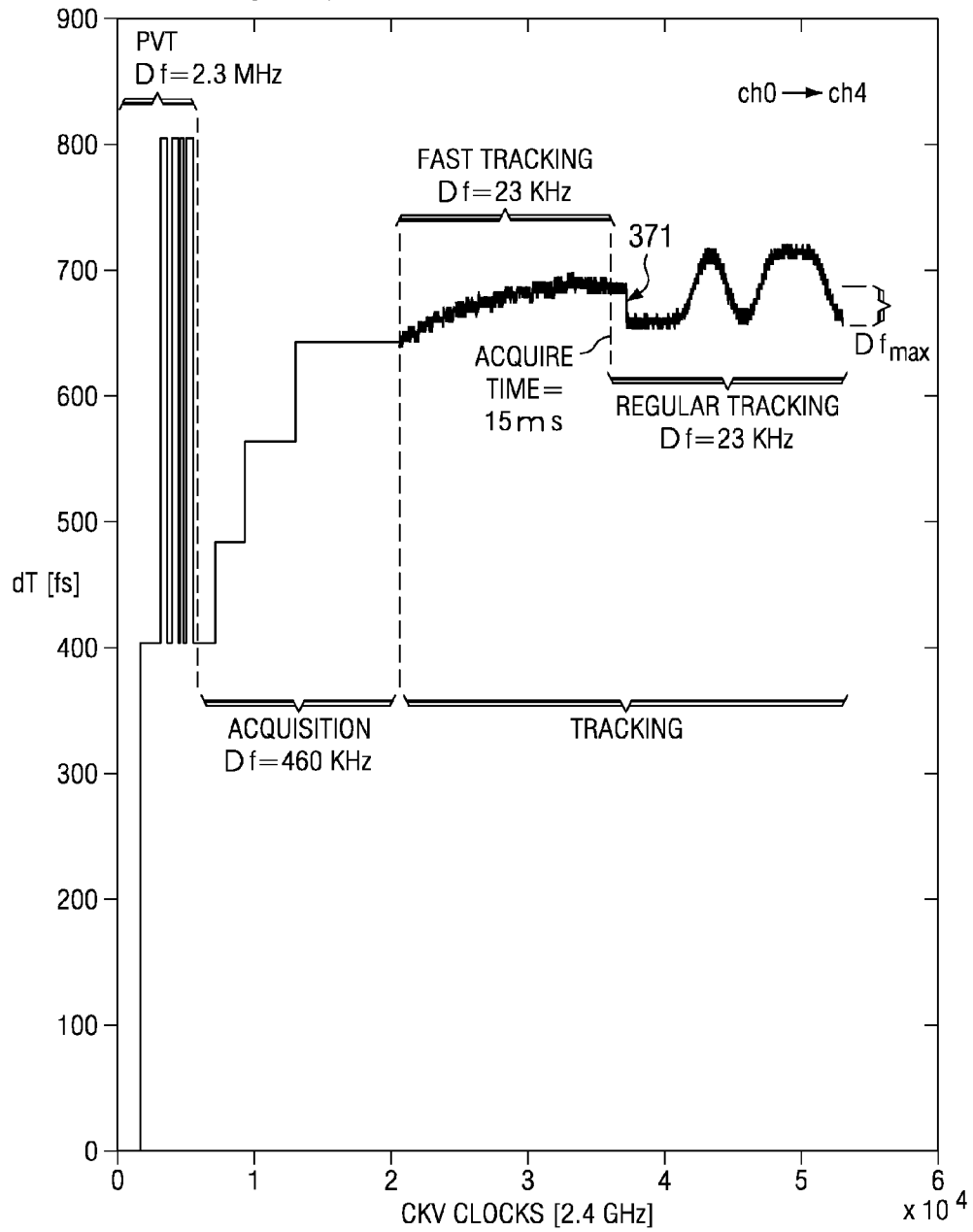
FIG. 37 is a timing diagram which graphically illustrates an example of the operations of FIG. 10.

Referring to FIG. 37, at the end of the fast tracking and beginning of the regular tracking PLL operation, there is a sudden frequency jump at 371 marking the beginning of the proper transmit modulation mode. This $\Delta f_{max}$ frequency jump is a carrier-to-symbol jump that corresponds (in this example) to the maximum negative frequency deviation for data bit "0" (that corresponds to the "−1.0" symbol):

$$\Delta f_{max} = m/2 \cdot R \quad (55)$$

where m is the GFSK modulation index and R is the data rate. (For BLUETOOTH, m=0.32 and R=1 Mb/s resulting in $\Delta f_{max}$=160 kHz; for GSM, m=0.5 and R=270.833 kb/s resulting in $\Delta f_{max}$=67.708 kHz.) Since the frequency jump is precisely known as commanded by a modulating data part (FCW_DT) of the frequency command word FCW, the tuning control word OTW can be observed in the steady-state in order to determine $K_{DCO}$.

$$K_{DCO}(f) = \frac{\Delta f_{max}}{\Delta(OTW)_{max}} \quad (56)$$

Figure 38:
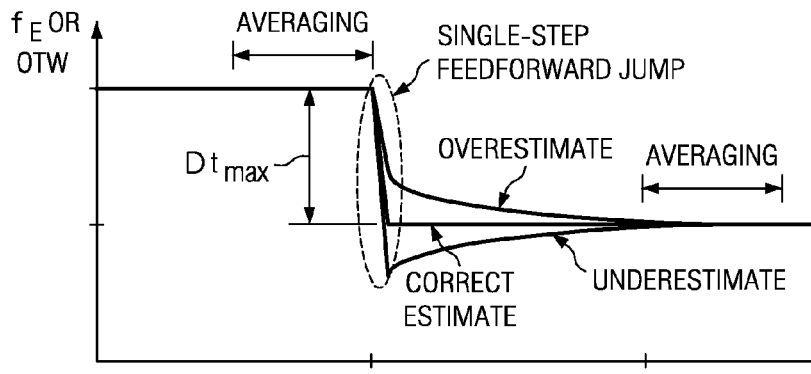
FIG. 38 graphically illustrates an example of estimating the gain of a digitally controlled oscillator according to the invention.

FIG. 38 illustrates DCO gain estimation by measuring the tuning word change in response to a fixed frequency jump. If the $K_{DCO}$ gain is estimated correctly to start with, the precise frequency shift will be accomplished in one step, as shown in FIG. 38. However, if the $K_{DCO}$ is not estimated accurately (i.e., $\hat{K}_{DCO} \neq K_{DCO}$), then the first frequency jump step will be off target by $$\frac{K_{DCO}}{\hat{K}_{DCO}} - 1$$

so a number of clock cycles will be needed to correct the estimation error through the normal PLL loop dynamics. The $K_{DCO}$ gain can be simply calculated as the ratio of $\Delta f_{max}$ to the oscillator tuning word difference. To lower the measurement variance, some embodiments average out the tuning inputs before and after the transition, as shown in FIG. 38.

In order to further improve the estimate, a larger frequency step of $2 \cdot \Delta f_{max}$ (a symbol-to-symbol change), covering the whole data modulation range, could be performed.

FIG. 37 is a simulation plot of exemplary transmit modulation at @2.4 GHz RF output. FIG. 37 shows the composite trajectory plot of the instantaneous frequency deviation while illustrating operation of various PLL modes. The x-axis is time in units of CKV clocks, where each CKV clock is about 417 ps. The y-axis is the frequency deviation from an initial value of 2402 MHz (channel 0) expressed in femtosecond (fs) time units, where 1 fs corresponds to 5.77 kHz.

The initial starting point in FIG. 37 is the center frequency set to channel zero. At power-up, a "cold start" to channel four at 4 MHz away is initiated. The ADPLL operates first in the PVT mode by enabling the PVT oscillator controller (OP of FIG. 13). This controller makes very coarse (2.3 MHz) adjustments to the frequency. Next, the output of the PVT controller is put on hold and the acquisition oscillator controller (OA of FIG. 13) is enabled. The acquisition controller quickly brings the frequency near the selected channel in 460 kHz steps. After acquisition of the selected channel is complete, the output of the OA controller is put on hold and the integer tracking oscillator controller OTI (see also FIG. 13) and fractional tracking oscillator controller OTF (see also FIG. 13) are enabled. In the tracking mode, the frequency steps are the finest (less than 1 kHz). The regular tracking mode completes the channel acquisition and frequency locking. The locking process takes altogether 15 μs with the reference frequency of 13 MHz (about 36 thousand CKV cycles or 196 FREF cycles). Upon reaching this steady state, the data modulation takes place.

FIG. 39 illustrates exemplary operations for calculating the DCO gain estimate according to the invention. After the desired frequency is acquired at 391, $N_1$ samples of OTW are averaged together at 392, and the result is stored as $OTW_1$ at 393. Thereafter, a suitable frequency change is imposed at 394. After waiting for W cycles of CKV at 395, $N_2$ samples of OTW are averaged together at 396 to obtain a further averaged OTW result referred to as $OTW_2$. At 397, the frequency change and the average OTW values are used to calculate the $K_{DCO}$ estimate or the $K_{DCO}$ normalization multiplier estimate. In some exemplary embodiments, $N_1=N_2=32$, and $W=64$.

FIG. 40 diagrammatically illustrates exemplary embodiments of a DCO gain estimator according to the invention. As shown in FIG. 40, the oscillator tuning word OTW is stored in a storage device 1710 during each cycle of CKR. A selector 1720 is coupled to the storage device 1710 for selecting therefrom the oscillator tuning words that will be used in the $K_{DCO}$ estimation. The selector 1720 provides the selected oscillator tuning words (e.g., $N_1$ or $N_2$ samples of OTW) to a calculator 1730 which performs suitable calculations to produce $\Delta(OTW)_{max}$. For example, the calculator 1730 can produce $OTW_1$, $OTW_2$ and $\Delta(OTW)_{max}$ (i.e., $OTW_2-OTW_1$) based on OTW samples selected by selector 1720. $\Delta f_{max}$ (or $2 \cdot \Delta f_{max}$) is divided into $\Delta(OTW)_{max}$ at 1740 to produce the DCO gain estimate $\hat{K}_{DCO}$.

The selector 1720 also receives as inputs the data signal y(k) and the clock signal CKR. Data signal y(k) will be changed to cause the frequency to change (by $\Delta f_{max}$ or $2 \cdot \Delta f_{max}$), and will thereby instruct selector 1720 to begin counting up to W cycles of CKR and to thereafter obtain $N_2$ samples of OTW (see also FIG. 39).

Figure 41:
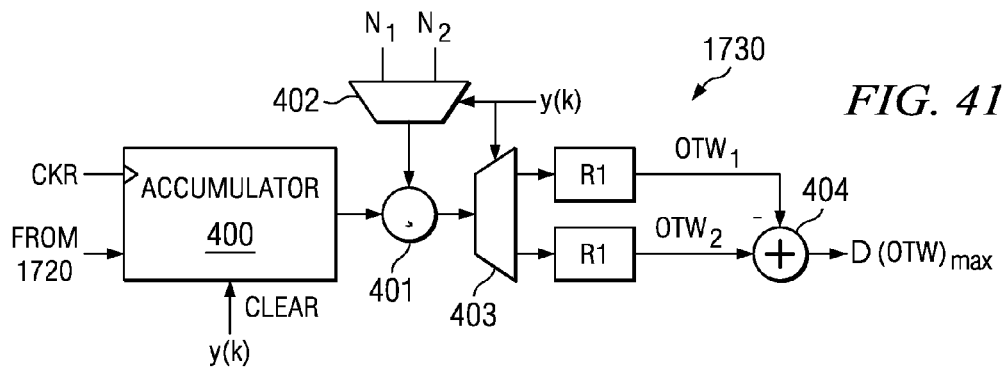
FIG. 41 diagrammatically illustrates exemplary embodiments of the calculator of FIG. 40.

FIG. 41 shows that exemplary embodiments of the calculator 1730 can include an additive accumulator 400 whose output is applied to a divider 401 for division by $N_1$ or $N_2$, as selected by y(k) at 402. A change in y(k) initiates the desired frequency change, which also signals a switch from $N_1$ (and $OTW_1$) to $N_2$ (and $OTW_2$). The division result is one of the averages $OTW_1$ or $OTW_2$, and is stored in a respectively corresponding register R1 or R2 selected by y(k) at 403. The difference $OTW_2-OTW_1$ (i.e., $\Delta(OTW)_{max}$) is calculated at 404 each time register R2 is loaded with another $OTW_2$ value.

Although the $K_{DCO}$ estimation described above observes the behavior of OTW in response to a known frequency change, it should be clear that other embodiments can perform the $K_{DCO}$ estimation by analogously observing the behavior of NTW or $\phi_E$ (see also FIG. 38) in response to a known frequency change.

Figure 43:
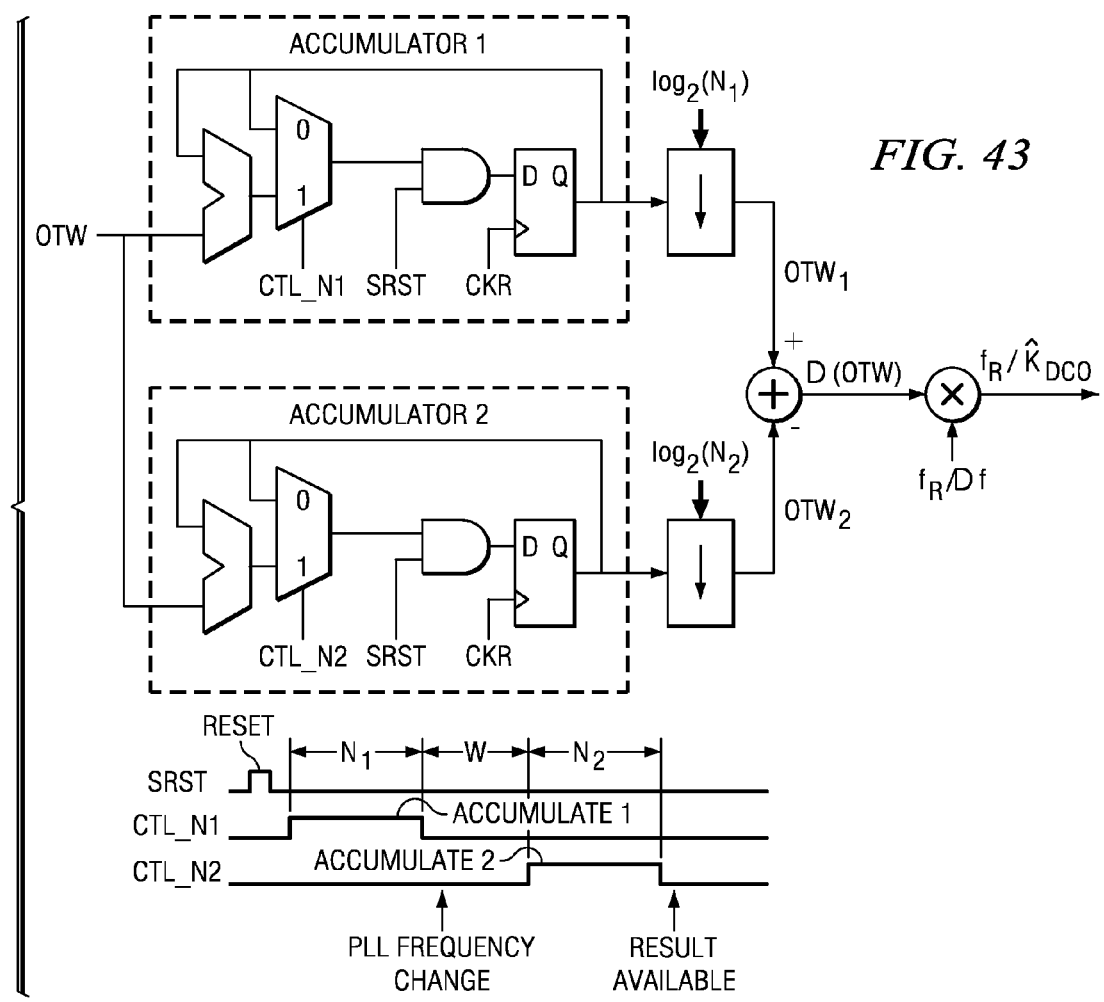
FIG. 43 diagrammatically illustrates further exemplary embodiments of a gain estimator for a digitally controlled oscillator according to the invention.

FIG. 43 illustrates further exemplary embodiments of a DCO gain estimator according to the invention. In FIG. 43, the DCO normalizing gain $f_R/\hat{K}_{DCO}$ is estimated. All the memory elements (registers) are synchronously reset at the beginning of the operation by asserting the SRST control signal. At the appropriate times, $N_1$ and $N_2$ samples of OTW are summed and stored by Accumulator 1 and Accumulator 2, respectively. It is very convenient to limit $N_1$ and $N_2$ to power-of-2 integers, since the division operation simplifies now to a trivial right-bit-shift. The difference between the averaged oscillator tuning words, $\Delta(OTW)$, is multiplied by a constant $f_R/\Delta f$ to arrive at the DCO normalizing gain estimate.

Figure 42:
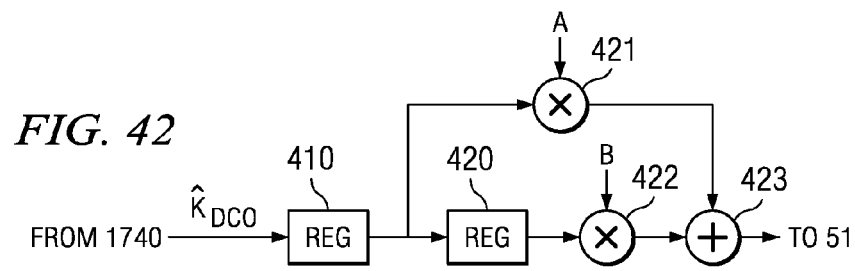
FIG. 42 diagrammatically illustrates further exemplary embodiments of a gain estimator for a digitally controlled oscillator according to the invention.

In some embodiments, such as shown in FIG. 42, the currently and previously calculated values of $\hat{K}_{DCO}$ (or $f_R/\hat{K}_{DCO}$) are stored in registers 410 and 420, respectively, and are proportionately combined, using multipliers 421 and 422, and adder 433, to produce a combined $\hat{K}_{DCO}$ (or $f_R/\hat{K}_{DCO}$) value. In some exemplary embodiments, the weighting factors A and B are A=0.75 and B=0.25.

Figure 44:
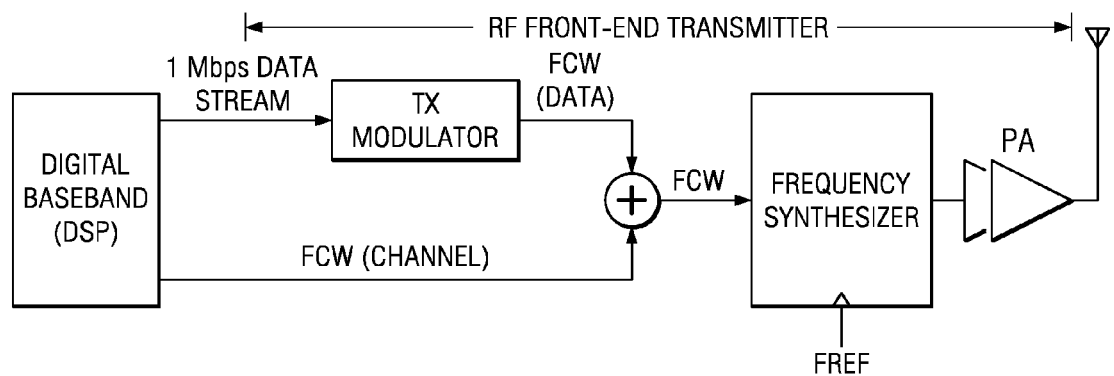
FIG. 44 diagrammatically illustrates an exemplary RF transmitter including a frequency synthesizer such as shown in FIGS. 31-35.
Figure 45:
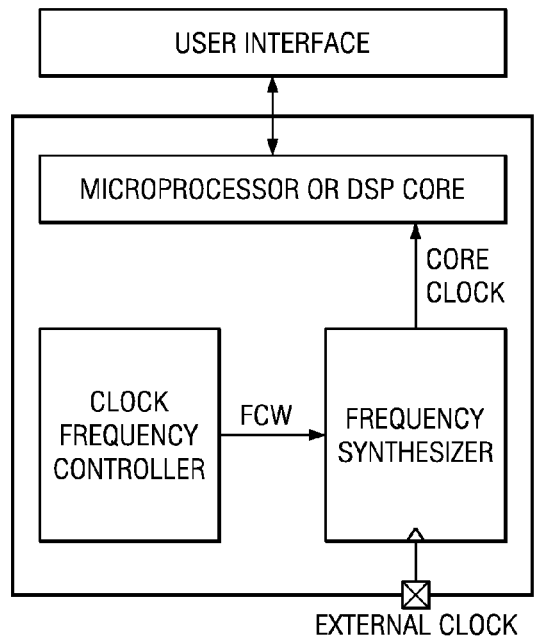
FIG. 45 diagrammatically illustrates an exemplary microprocessor or DSP including a frequency synthesizer such as shown in FIGS. 31-35.

FIGS. 44 and 45 diagrammatically illustrate examples of a frequency synthesizer such as shown in FIGS. 31-35 incorporated in an RF transmitter (FIG. 44) and a microprocessor or DSP (FIG. 45). In the microprocessor/DSP example of FIG. 45, the external clock can be produced by a crystal oscillator (for example 20 MHz) module. The core clock can be in the range of hundreds of MHz up to several GHz. The clock frequency controller of FIG. 45 controls the frequency multiplication ratio FCW (integer in some examples). The clock frequency controller could, for example, control the frequency synthesizer such that the core clock frequency is adjusted to the expected computational load, which is particularly useful in products such as laptop computers. If the DCO gain can be estimated with reasonable accuracy, then the frequency of the core clock produced by the frequency synthesizer could be stepped up or down very rapidly. The user interface in FIG. 45 can include, for example, one or more of: a keyboard, keypad, mouse or other tactile interface; a visual interface such as a monitor; and an audio interface such as a microphone or speaker. The user application(s) of FIG. 1 could be run, for example, on the microprocessor/DSP of FIG. 45.

Although exemplary embodiments of the invention are described above in detail, this does not limit the scope of the invention, which can be practiced in a variety of embodiments.

What is claimed is:

1. An apparatus for controlling a digitally controlled oscillator device in a frequency synthesizer, comprising:
    tuning output for providing a digital control word that includes information for use in tuning the digitally controlled oscillator device;
    a first input for receiving a first digital value produced in response to the frequency synthesizer and representative of a first phase difference, at a first point in time, between a reference signal and an output signal produced by the digitally controlled oscillator device;
    a second input for receiving a second digital value produced in response to the frequency synthesizer and representative of a second phase difference, at a second point in time which is timewise separated from the first point in time, between the reference signal and said output signal produced by the digitally controlled oscillator device; and
    a gain controller coupled to said first and second inputs and said output for adjusting said digital control word based on said first and second digital values.

2. The apparatus of claim 1, wherein said gain controller includes a combiner for combining said first and second digital values to produce a combined value, said gain controller for adjusting said digital control word based on said combined value.

3. The apparatus of claim 2, wherein said gain controller includes logic coupled to said combiner for providing an output value based on said combined value and for adjusting said digital control word based on said output value.

4. The apparatus of claim 3, wherein said combiner includes a subtractor for determining said combined value as a difference value which represents a difference between said first and second digital values.

5. The apparatus of claim 4, wherein said logic includes a comparator coupled to said subtractor for determining a relationship between said difference value and a predetermined range of values, said logic responsive to said comparator for adjusting said digital control word only when said difference value is outside of said predetermined range.

6. The apparatus of claim 5, wherein said first input is for receiving a first sequence of said first digital values respectively representative of corresponding said first phase differences at respective points in time, said subtractor for determining a second sequence of said difference values which respectively represent differences between said second digital value and said first digital values of said first sequence, said comparator for determining respective relationships between said difference values and said predetermined range, and said logic responsive to said comparator for adjusting said digital control word only when each said difference value produced by said subtractor during a predetermined period of time is outside of said predetermined range.

7. The apparatus of claim 4, wherein said difference value is said output value, and including a digital control word input for receiving a preliminary digital control word produced by the frequency synthesizer, said logic including a further combiner coupled to said digital control word input for combining said preliminary digital control word with said difference value to produce said digital control word at said output.

8. The apparatus of claim 7, wherein said further combiner includes a subtractor for subtracting said difference value from said preliminary digital control word to produce said digital control word at said output.

9. The apparatus of claim 3, wherein said logic includes a proportional loop gain multiplier of the frequency synthesizer, said logic further including a look-up table coupled to said proportional gain multiplier, said look-up table responsive to said output value for providing a gain multiplication factor to said proportional loop gain multiplier, said proportional loop gain multiplier coupled to said output for providing said digital control word at said output in response to said gain multiplication factor.

10. The apparatus of claim 3, including a digital control word input for receiving a preliminary digital control word produced by the frequency synthesizer, said logic including a further combiner coupled to said digital control word input for combining said output value with said preliminary digital control word to produce said digital control word at said output.

11. The apparatus of claim 10, wherein said further combiner includes a subtractor for subtracting said output value from said preliminary digital control word to produce said digital control word at said output.

12. The apparatus of claim 1, wherein said first input is for receiving a first sequence of said first digital values respectively representative of corresponding said first phase differences at respective points in time, said gain controller for adjusting said digital control word based on said first sequence and said second digital value.

13. The apparatus of claim 1, wherein said first digital value is a phase difference value produced by the frequency synthesizer.

14. The apparatus of claim 13, wherein said second digital value is a phase difference value produced by the frequency synthesizer.

15. The apparatus of claim 1, wherein said first digital value is an average of a plurality of phase difference values produced by the frequency synthesizer during a period of time including said first point in time.

16. The apparatus of claim 15, wherein said second digital value is an average of a plurality of phase difference values produced by the frequency synthesizer during a period of time including said second point in time.

17. The apparatus of claim 1, including a further output for providing a further digital control word in response to which said first-mentioned digital control word is produced, said gain controller coupled to said further output for adjusting said further digital control word based on said first and second digital values.

18. A data processing apparatus, comprising:
a data processor for performing digital data processing operations;
a man/machine interface coupled to said data processor for permitting a user to communicate with said data processor;
a frequency synthesizer coupled to said data processor for producing a periodic signal having a desired frequency for use in transferring data produced by said data processor, said frequency synthesizer including a digitally controlled oscillator device; and
an apparatus coupled to said frequency synthesizer for controlling said digitally controlled oscillator device, including an output for providing a digital control word that includes information for use in tuning the digitally controlled oscillator device, a first input for receiving a first digital value produced in response to the frequency synthesizer and representative of a first phase difference, at a first point in time, between a reference signal and an output signal produced by the digitally controlled oscillator device, a second input for receiving a second digital value produced in response to the frequency synthesizer and representative of a second phase difference, at a second point in time which is timewise separated from the first point in time, between the reference signal and said output signal, and a gain controller coupled to said first and second inputs and said output for adjusting said digital control word based on said first and second digital values.

19. The apparatus of claim 18, provided as one of a cellular telephone, a Bluetooth apparatus and a laptop computer.

20. The apparatus of claim 18, wherein said periodic signal is for use in transferring said data on a communication link.

21. The apparatus of claim 18, wherein said periodic signal is a clock signal for said data processor.

22. The apparatus of claim 18, wherein said man/machine interface includes one of a tactile interface, a visual interface and an audio interface.

23. A method of controlling a digitally controlled oscillator device in a frequency synthesizer, comprising:
receiving a first digital value produced in response to the frequency synthesizer and representative of a first phase difference, at a first point in time, between a reference signal and an output signal produced by the digitally controlled oscillator device;
receiving a second digital value produced in response to the frequency synthesizer and representative of a second phase difference, at a second point in time which is timewise separated from the first point in time, between the reference signal and said output signal; and
based on said first and second digital values, adjusting a digital control word that includes information for use in tuning the digitally controlled oscillator device.

24. The method of claim 23, including combining said first and second digital values to produce a combined value, said adjusting step including adjusting said digital control word based on said combined value.

25. The method of claim 24, including providing an output value based on said combined value, said adjusting step including adjusting said digital control word based on said output value.

26. The method of claim 25, wherein said combining step includes determining said combined value as a difference value which represents a difference between said first and second digital values.

27. The method of claim 26, wherein said adjusting step includes adjusting said digital control word only when said difference value is outside of a predetermined range of values.

28. The method of claim 27, wherein said step of receiving said first digital value includes receiving a first sequence of said first digital values respectively representative of corresponding said first phase differences at respective points in time, said determining step including determining a second sequence of said difference values which respectively represent differences between said second digital value and said first digital values of said first sequence, and said adjusting step including adjusting said digital control word only when each said difference value during a predetermined period of time within said second sequence is outside of said predetermined range.

29. The method of claim 26, wherein said difference value is said output value, and including receiving a preliminary digital control word produced by the frequency synthesizer, said adjusting step including combining said preliminary digital control word with said difference value to produce said digital control word.

30. The method of claim 29, wherein said adjusting step includes subtracting said difference value from said preliminary digital control word to produce said digital control word.

31. The method of claim 25, including receiving a preliminary digital control word produced by the frequency synthesizer, said adjusting step including combining said output value with said preliminary digital control word to produce said digital control word.

32. The method of claim 31, wherein said last-mentioned combining step includes subtracting said output value from said preliminary digital control word to produce said digital control word.

33. The method of claim 23, wherein said step of receiving said first digital value includes receiving a first sequence of said first digital values respectively representative of corresponding said first phase differences at respective points in time, said adjusting step including adjusting said digital control word based on said first sequence and said second digital value.

34. A data processing apparatus, comprising:
a data processor for performing digital data processing operations; a frequency synthesizer coupled to said data processor for producing a periodic signal having a desired frequency for use in transferring data produced by said data processor, said frequency synthesizer including a digitally controlled oscillator device; and
an apparatus coupled to said frequency synthesizer for controlling said digitally controlled oscillator device, including an output for providing a digital control word that includes information for use in tuning the digitally controlled oscillator device, a first input for receiving a first digital value produced in response to the frequency synthesizer and representative of a first phase difference, at a first point in time, between a reference signal and an output signal produced by the digitally controlled oscillator device, a second input for receiving a second digital value produced in response to the frequency synthesizer and representative of a second phase difference, at a second point in time which is timewise separated from the first point in time, between the reference signal and said output signal, and a gain controller coupled to said first and second inputs and said output for adjusting said digital control word based on said first and second digital values.

35. The apparatus of claim 34, provided as one of a microprocessor, a digital signal processor and an RF front end apparatus.

36. A frequency synthesizer apparatus, comprising:
a control loop for providing a digital control word; a digitally controlled oscillator device coupled to said control loop for producing in response to said digital control word a periodic signal having a desired frequency; and
an apparatus coupled to said control loop for adjusting said digital control word, including a first input for receiving a first digital value produced in response to said control loop and representative of a first phase difference, at a first point in time, between a reference signal and an output signal produced by the digitally controlled oscillator, a second input for receiving a second digital value produced in response to said control loop and representative of a second phase difference, at a second point in time which is timewise separated from the first point in time, between the reference signal and said output signal, and a gain controller coupled to said first and second inputs for adjusting said digital control word based on said first and second digital values.

37. An apparatus for controlling a digitally controlled oscillator device in a frequency synthesizer, comprising:
an output for providing a digital control word that includes information for use in tuning the digitally controlled oscillator device;
an input for receiving a digital value produced in response to the frequency synthesizer and representative of a phase difference between a reference signal and an output signal produced by the digitally controlled oscillator device; and
a gain controller coupled to said input and said output for adjusting said digital control word, said gain controller includes logic for comparing a difference between a current value and a past value of said input to a threshold and producing a trigger signal.

38. The apparatus of claim 37, wherein said trigger signal modifies said output.

39. The apparatus of claim 37, wherein said trigger signal changes loop response of the frequency synthesizer.

* * * * *